(12) United States Patent
Yamazaki et al.

(10) Patent No.: US 8,753,491 B2
(45) Date of Patent: Jun. 17, 2014

(54) METHOD FOR PACKAGING TARGET MATERIAL AND METHOD FOR MOUNTING TARGET

(75) Inventors: Shunpei Yamazaki, Tokyo (JP); Toru Takayama, Kanagawa (JP); Keiji Sato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 315 days.

(21) Appl. No.: 12/945,296

(22) Filed: Nov. 12, 2010

(65) Prior Publication Data

US 2011/0114480 A1    May 19, 2011

(30) Foreign Application Priority Data

Nov. 13, 2009  (JP) ................................ 2009-260414

(51) Int. Cl.
C23C 14/34    (2006.01)
(52) U.S. Cl.
USPC ............... 204/298.12; 204/192; 204/192.12; 204/298.13
(58) Field of Classification Search
CPC ............. C23C 14/3407; C23C 14/3414; H01J 37/3435; H01L 27/1225
USPC ............... 204/298.12, 298.13, 192.1, 192.12
See application file for complete search history.

(56) References Cited

U.S. PATENT DOCUMENTS

| | | | |
|---|---|---|---|
| 4,116,791 A * | 9/1978 | Zega .............................. 427/524 |
| 4,938,798 A * | 7/1990 | Chiba et al. ...................... 75/230 |
| 5,731,856 A | 3/1998 | Kim et al. |
| 5,744,864 A | 4/1998 | Cillessen et al. |
| 5,783,818 A * | 7/1998 | Manabe et al. ................ 250/239 |
| 5,846,389 A * | 12/1998 | Levine et al. ............... 204/192.1 |
| 6,030,514 A * | 2/2000 | Dunlop et al. ............ 204/298.12 |
| 6,085,591 A * | 7/2000 | Mallard .......................... 73/627 |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,891,236 B1 | 5/2005 | Yamazaki |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,461 B2 | 5/2007 | Sakata et |
| 7,211,825 B2 | 5/2007 | Shih et al. |

(Continued)

FOREIGN PATENT DOCUMENTS

EP    1 737 044 A1    12/2006
EP    2 096 188 A1    9/2009

(Continued)

OTHER PUBLICATIONS

Machine Translation JP 2003-089870 dated Mar. 2003.*

(Continued)

*Primary Examiner* — Rodney McDonald
(74) *Attorney, Agent, or Firm* — Fish & Richardson P.C.

(57) ABSTRACT

It is an object to provide a method for packaging a target material with which a thin film that is less contaminated with an impurity in the air such as a compound containing a hydrogen atom can be formed. In addition, it is an object to provide a method for mounting a target with which a thin film that is less contaminated with an impurity can be formed. In order to achieve the objects, a target material in a target is not exposed to the air and kept sealed after being manufactured until a deposition apparatus on which the target is mounted is evacuated.

17 Claims, 25 Drawing Sheets

(56) References Cited

U.S. PATENT DOCUMENTS

| | | |
|---|---|---|
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,491,655 B2 | 2/2009 | Yamazaki |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0084305 A1 | 5/2004 | Fukuchi et al. |
| 2004/0109940 A1* | 6/2004 | Kugai et al. .................. 427/58 |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0151314 A1 | 7/2006 | Fukuchi et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0186852 A1 | 8/2007 | Sakata et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0108502 A1* | 5/2010 | Inoue et al. .............. 204/298.13 |
| 2010/0109002 A1 | 5/2010 | Itagaki et al. |
| 2010/0136743 A1 | 6/2010 | Akimoto et al. |
| 2010/0219410 A1 | 9/2010 | Godo et al. |
| 2011/0162322 A1 | 7/2011 | Satoh et al. |
| 2014/0001040 A1 | 1/2014 | Inoue et al. |

FOREIGN PATENT DOCUMENTS

| | | |
|---|---|---|
| EP | 2 226 847 A2 | 9/2010 |
| EP | 2 471 972 A1 | 7/2012 |
| EP | 2 669 402 A1 | 12/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-159372 A | 6/1990 |
| JP | 04-231461 A | 8/1992 |
| JP | 05-125526 A | 5/1993 |
| JP | 05-251705 A | 9/1993 |
| JP | 07-003443 * | 1/1995 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-511115 A | 4/2002 |
| JP | 2002-212718 A | 7/2002 |
| JP | 2002-289859 A | 10/2002 |
| JP | 2003-086000 A | 3/2003 |
| JP | 2003-086808 A | 3/2003 |
| JP | 2003-089870 * | 3/2003 |
| JP | 2004-103957 A | 4/2004 |
| JP | 2004-263299 A | 9/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2008-144246 A | 6/2008 |
| JP | 04-231461 B2 | 2/2009 |
| JP | 2009-168937 A | 7/2009 |
| WO | 98/50598 A1 | 11/1998 |
| WO | 2004/114391 A1 | 12/2004 |
| WO | WO 2008/072486 * | 6/2008 |
| WO | 2010/050409 A1 | 5/2010 |

OTHER PUBLICATIONS

Machine Translation JP 07-003443 dated Jan. 1995.*

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(56) References Cited

OTHER PUBLICATIONS

Orita, M et al., "Amorphous transparent conductive oxide InGa03(ZnO)m (m<4):a Zn4s conductor," Philosophical Magazine, 2001, vol. 81, No. 5, pp. 501-515.

Orita, M et al., "Mechanism of Electrical Conductivity of Transparent InGaZn04," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Veno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

(56) References Cited

OTHER PUBLICATIONS

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel, YBFE2O4, and YB2FE3O7 Types of Structures for Compounds in the In2O3 and SC2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09 : SID International Symposium Digest of Technical Papers, May 31, 2009, pp. 284-287.

* cited by examiner

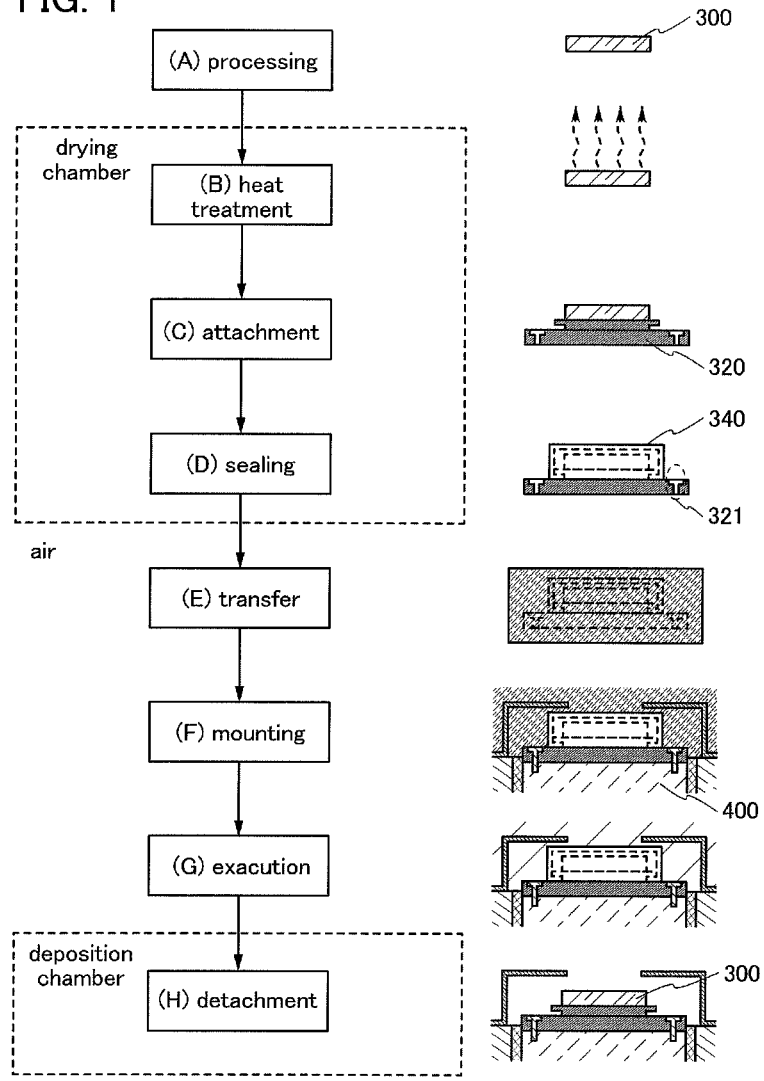

FIG. 3A
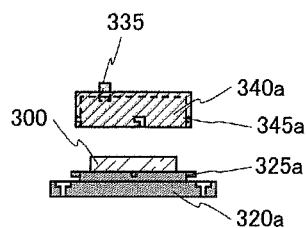
FIG. 3B-1  FIG. 3B-2
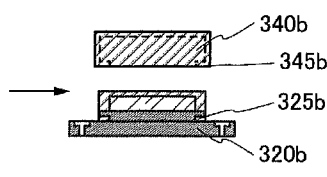 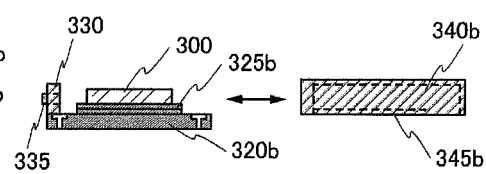
FIG. 3C-1  FIG. 3C-2
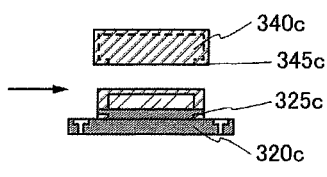 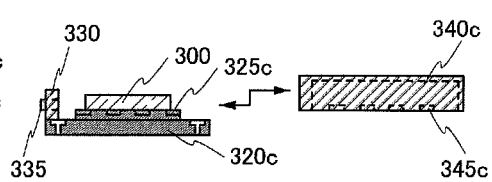
FIG. 3D-1  FIG. 3D-2
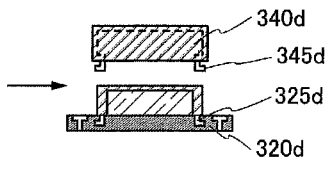 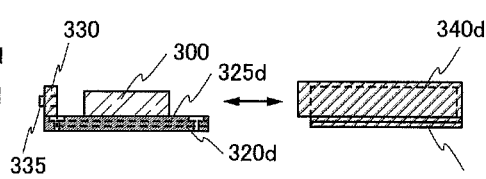

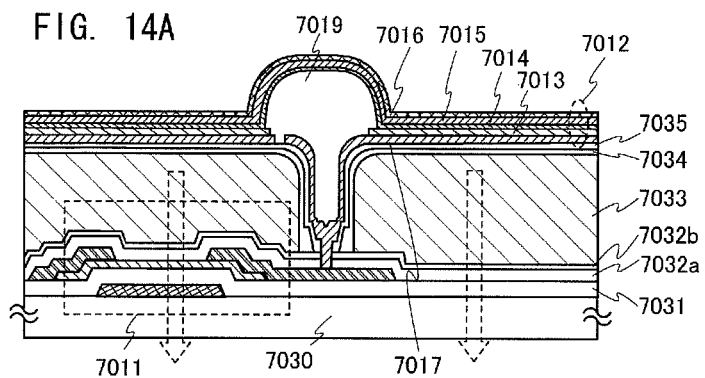
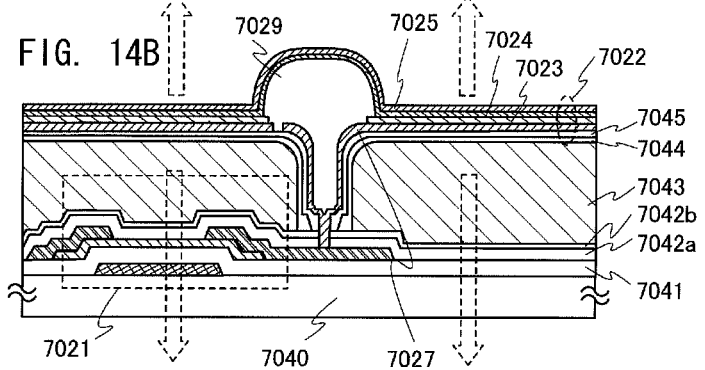
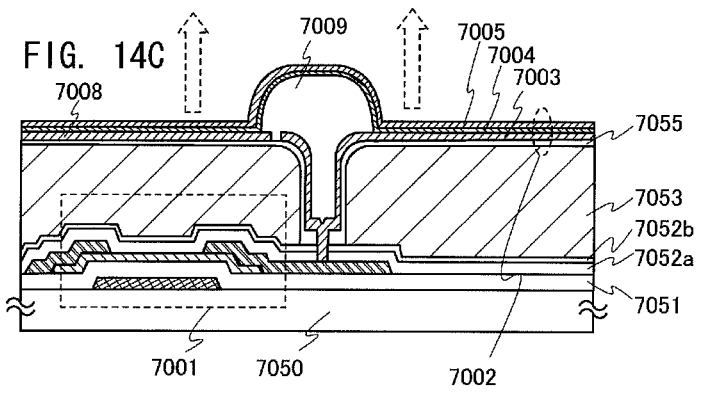

METHOD FOR PACKAGING TARGET MATERIAL AND METHOD FOR MOUNTING TARGET

BACKGROUND OF THE INVENTION

1. Field of the Invention

The present invention relates to a method for packaging a target material and a method for mounting a target on an apparatus. Specifically, the present invention relates to a method for packaging a sputtering target material containing a deposition material and a method for mounting a target on a deposition apparatus.

2. Description of the Related Art

A physical vapor deposition method with the use of a target enables thin films of a variety of materials to be formed. Examples of a physical vapor deposition method with the use of a target include a sputtering method and a pulsed laser deposition method. In particular, with a sputtering method, a film can be easily formed over a large-area substrate, and further, even a material whose melting point is high and whose vapor pressure is low can be deposited, for example. In addition, by introducing a reactive gas into a deposition chamber, metal oxide, metal nitride, and the like can be deposited over a substrate. Furthermore, a sputtering method has merits such as relatively less damage to a substrate and is one of important techniques in thin film formation.

In a sputtering method, a target material (a material used for sputtering) is used as a source material; therefore, the characteristics of a thin film which is formed are adversely affected by dusts or impurities attached to the target material. Accordingly, various techniques for preventing contamination of the target material have been disclosed. For example, a packaging technique for protecting the surface of a target material has been disclosed in Patent Document 1.

In addition, a technique of forming an oxide semiconductor film over a substrate such as a glass substrate, manufacturing a transistor using the oxide semiconductor film, and applying the transistor to an electronic device or an optical device has been attracting attention. For example, Patent Document 2 and Patent Document 3 disclose a technique by which a transistor is manufactured using zinc oxide or an In—Ga—Zn—O-based oxide semiconductor as a semiconductor material and such a transistor is used as a switching element or the like of an image display device.

An oxide semiconductor film can be formed at relatively low temperature by a sputtering method or the like and is suitable for a thin film transistor (also referred to as a TFT). A manufacturing process of a TFT using an oxide semiconductor film is simpler than that of a TFT using a polycrystalline silicon film. In addition, a TFT in which a channel formation region (also referred to as a channel region) is provided in an oxide semiconductor can have higher field effect mobility than a TFT using amorphous silicon.

Transistors which include oxide semiconductors can be formed not only over a glass substrate but also over a plastic substrate and thus are expected to be applied to display devices such as liquid crystal displays, electroluminescent displays (also referred to as EL displays), or electronic papers.

REFERENCE

Patent Document

[Patent Document 1] Japanese Published Patent Application No. H04-231461

[Patent Document 2] Japanese Published Patent Application No. 2007-123861

[Patent Document 3] Japanese Published Patent Application No. 2007-096055

SUMMARY OF THE INVENTION

However, a semiconductor element including an oxide semiconductor film has not had excellent characteristics. For example, a controlled threshold voltage, high operation speed, a relatively easy manufacturing process, and sufficient reliability are required for a transistor including an oxide semiconductor film.

In particular, the concentration of carriers in an oxide semiconductor film has influence on the threshold voltage of a transistor including the oxide semiconductor film. The carriers in the oxide semiconductor film are generated due to an impurity contained in the oxide semiconductor film. For example, a compound containing a hydrogen atom such as $H_2O$, or an impurity such as a hydrogen atom which is contained in the deposited oxide semiconductor film causes an increase in carrier concentration in the oxide semiconductor film.

Therefore, in order to provide a transistor with a controlled threshold voltage with the use of an oxide semiconductor film, it is necessary to reduce a compound containing a hydrogen atom such as $H_2O$, or an impurity such as a hydrogen atom as much as possible.

However, a deposition target material for an oxide semiconductor film contains a substance with strong polarity such as metal oxide and thus easily adsorbs or absorbs an impurity in the air (such as moisture). Thus, an oxide semiconductor film which is formed using a target material that adsorbs or absorbs an impurity is contaminated with the impurity.

Also, a target material containing a metal for forming a metal film easily adsorbs or absorbs an impurity in the air (such as moisture). A metal film which is formed using a target material containing a metal that adsorbs or absorbs an impurity is contaminated with the impurity.

When the metal film contaminated with the impurity of the air is formed in contact with an oxide semiconductor film, an impurity containing a hydrogen atom such as moisture or the like is diffused from the metal film into the oxide semiconductor film. The present invention is made in view of the foregoing technical background.

It is an object of an embodiment of the present invention to provide a method for packaging a target material with which a thin film that is less contaminated with an impurity in the air (such as a compound containing a hydrogen atom) can be formed. In addition, it is an object to provide a method for mounting a target with which a thin film that is less contaminated with an impurity can be formed.

In order to achieve the above-described object, a target material (a sintered body, for example) is not exposed to the air and kept sealed after being manufactured until a deposition chamber of a deposition apparatus on which the target material is mounted is evacuated.

That is, an embodiment of the present invention is a packaged sputtering target comprising a backing plate including a mounting portion for a placement portion, a sintered body fixed to the backing plate, and a package attached to the backing plate so as to surround the sintered body without covering the mounting portion. In addition, an inside of the package is filled with a dry air.

Another embodiment of the present invention is the packaged sputtering target, wherein the inside of the package is filled with a gas whose dew point is less than or equal to −40° C.

Another embodiment of the present invention is the packaged sputtering target, wherein the sintered body comprises metal oxide.

Another embodiment of the present invention is the packaged sputtering target, wherein the metal oxide comprises indium, gallium, and zinc.

Another embodiment of the present invention is the packaged sputtering target, wherein the sintered body comprises metal.

Another embodiment of the present invention is the packaged sputtering target, wherein the metal comprises at least one of Al, Cu, Cr, Ta, Ti, Mo, and W.

Another embodiment of the present invention is a method for packaging a sputtering target, comprising, in a dry atmosphere in which the dew point is less than or equal to −40° C., fixing a sintered body to a backing plate including a mounting portion for a placement portion, and attaching a package to the backing plate so as to surround the sintered body without covering the mounting portion.

Another embodiment of the present invention is a method for mounting a packaged sputtering target, comprising, in a dry atmosphere in which the dew point is less than or equal to −40° C., storing a target material in a package without covering a mounting portion for a placement portion, mounting the target material stored in the package on the placement portion through a backing plate in a deposition chamber of a deposition apparatus, evacuating the deposition chamber, and detaching the package in the evacuated deposition chamber.

Note that the ordinal numbers such as "first" and "second" in this specification are used for convenience and do not denote the order of steps or the stacking order of layers. In addition, the ordinal numbers in this specification do not denote particular names which specify the invention.

Note that in this specification, oxynitride refers to a substance that contains more oxygen atoms than nitrogen atoms and nitride oxide refers to a substance that contains more nitrogen atoms than oxygen atoms. For example, a "silicon oxynitride film" means a film that contains more oxygen atoms than nitrogen atoms, and contains oxygen, nitrogen, silicon, and hydrogen at concentrations ranging from 50 at. % to 70 at. % inclusive, 0.5 at. % to 15 at. % inclusive, 25 at. % to 35 at. % inclusive, and 0.1 at. % to 10 at. % inclusive, respectively, when they are measured by RBS (Rutherford Backscattering Spectrometry) and HFS (Hydrogen Forward Scattering). Further, a "silicon nitride oxide film" means a film that contains more nitrogen atoms than oxygen atoms, and contains oxygen, nitrogen, silicon, and hydrogen at concentrations ranging from 5 at. % to 30 at. % inclusive, 20 at. % to 55 at. % inclusive, 25 at. % to 35 at. % inclusive, and 10 at. % to 30 at. % inclusive, respectively, when they are measured by RBS and HFS. Note that percentages of nitrogen, oxygen, silicon, and hydrogen fall within the ranges given above, where the total number of atoms contained in the silicon oxynitride film or the silicon nitride oxide film is defined as 100 at. %.

In this specification, an EL layer refers to a layer provided between a pair of electrodes in a light-emitting element. Thus, a light-emitting layer containing an organic compound that is a light-emitting substance which is provided between a pair of electrodes is an embodiment of the EL layer.

Note that in this specification, a light-emitting device refers to an image display device, a light-emitting device, or a light source (including a lighting device). In addition, the light-emitting device includes any of the following modules in its category: a module in which a connector such as an FPC (flexible printed circuit), a TAB (tape automated bonding) tape, or TCP (tape carrier package) is attached to a light-emitting device; a module having a TAB tape or a TCP provided with a printed wiring board at the end thereof; and a module having an IC (integrated circuit) directly mounted on a substrate provided with a light-emitting element by a COG (chip on glass) method.

In accordance with the present invention, it is possible to provide a method for packaging a target material with which a thin film that is less contaminated with an impurity in the air such as a compound containing a hydrogen atom can be formed. In addition, it is possible to provide a method for mounting a target with which a thin film that is less contaminated with an impurity can be formed.

BRIEF DESCRIPTION OF THE DRAWINGS

FIG. 1 illustrates steps from manufacture of a target to detachment of a package according to an embodiment.

FIGS. 3A to 3D-2 each illustrate a method for sealing a target material according to an embodiment.

FIGS. 10A-1 to 10B illustrate semiconductor devices according to an embodiment.

FIGS. 14A to 14C each illustrate a semiconductor device according to an embodiment.

DETAILED DESCRIPTION OF THE INVENTION

Figure 2A:
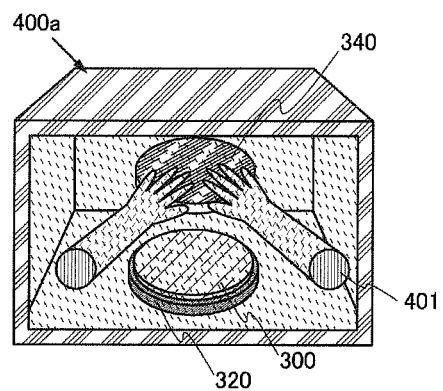
FIGS. 2A and 2B each illustrate a step of mounting a target according to an embodiment.
Figure 2B:
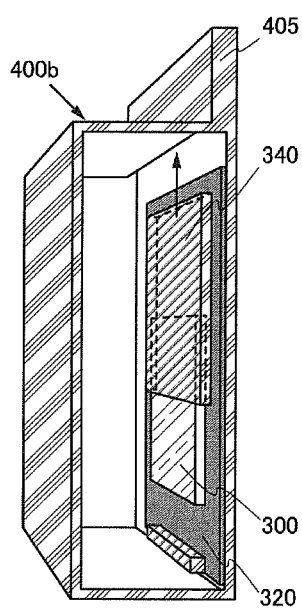

Embodiments will be described in detail with reference to the accompanying drawings. Note that the present invention is not limited to the following description, and it will be easily understood by those skilled in the art that modes and details thereof can be variously changed without departing from the spirit and the scope of the present invention. Therefore, the present invention should not be construed as being limited to the description of the following embodiments. Note that in the structures of the invention described below, the same portions or portions having similar functions are denoted by the same reference numerals in different drawings, and description of such portions is not repeated.

Embodiment 1

In this embodiment, steps from manufacture of a target which includes a backing plate with a mounting portion for a placement portion, a target material fixed to the backing plate, and a package attached to the backing plate so as to surround the target material without covering the mounting portion and in which an inside of the package is filled with a dry air to detachment of a package will be described with reference to FIG. 1. The steps include eight steps: (A) processing, (B) heat treatment, (C) attachment, (D) sealing, (E) transfer, (F) mounting, (G) evacuation, and (H) detachment. A sintered body is one mode of the target material.

First, a source material formed by baking is processed into a shape of a sintered body 300. The external size and unevenness of the surface of the source material are adjusted by machine processing to be suitable for a deposition apparatus in which a target is used. This step corresponds to (A) processing in FIG. 1. Alternatively, the source material may be processed into a desired shape by casting or the like.

An example of a target material for forming an oxide semiconductor film is obtained by appropriately mixing any of magnesium oxide (MgO), zinc oxide (ZnO), alumina ($Al_2O_3$), gallium oxide ($Ga_2O_3$), indium oxide ($In_2O_3$), and tin oxide ($SnO_2$) as a source material, baking the mixture, and processing it into the shape of a sintered body.

$SiO_2$ may be added to the source material at 2 wt % to 10 wt % inclusive so that the sintered body can contain $SiO_x$ ($x>0$). When the sintered body contains $SiO_x$ ($x>0$), crystallization of an oxide semiconductor film can be prevented. It is particularly preferable in the case of performing heat treatment for dehydration or dehydrogenation since the oxide semiconductor film can be prevented from being excessively crystallized.

By performing sputtering with the use of a target material having the above composition, any of the following oxide semiconductor films can be formed: a four-component-based metal oxide film such as an In—Sn—Ga—Zn—O film, a three-component-based metal oxide film such as an In—Ga—Zn—O film, an In—Sn—Zn—O film, an In—Al—Zn—O film, a Sn—Ga—Zn—O film, an Al—Ga—Zn—O film, or a Sn—Al—Zn—O film, a two-component-based metal oxide film such as an In—Zn—O film, a Sn—Zn—O film, an Al—Zn—O film, a Zn—Mg—O film, a Sn—Mg—O film, an In—Mg—O film, or an In—Ga—O film, and a film such as an In—O film, a Sn—O film, or a Zn—O film. Silicon oxide may be added to any of the above oxide semiconductor films. Addition of silicon oxide ($SiO_x$ ($x>0$)) which hinders crystallization into the oxide semiconductor film can suppress crystallization of the oxide semiconductor film.

In addition, a thin film of a material represented by $InMO_3(ZnO)_m$ ($m>0$) can be formed. Here, M represents one or more metal elements selected from Ga, Al, Mn, and Co. For example, M can be Ga, Ga and Al, Ga and Mn, Ga and Co, or the like. An oxide semiconductor whose composition formula is represented by $InMO_3(ZnO)_m$ ($m>0$) where at least Ga is contained as M is referred to as the In—Ga—Zn—O based oxide semiconductor described above, and a thin film thereof is referred to as an In—Ga—Zn—O film.

The filling rate of a sintered body which is used as a target material for forming an oxide semiconductor film is 90% to 100% inclusive, preferably 95% to 99.9% inclusive. With the use of the sintered body of the oxide semiconductor target having a high filling rate, a space to adsorb an impurity such as moisture can be removed, generation of nodules is prevented, uniform discharge is possible, and generation of particles can be suppressed. In addition, the formed oxide semiconductor film is a dense film. As a result, the impurity concentration is reduced and an oxide semiconductor film with a uniform quality can be obtained.

In this embodiment, as a target material for forming an In—Ga—Zn—O-based film, a sintered body of an oxide semiconductor containing In, Ga, and Zn (a specific composition ratio is $In_2O_3:Ga_2O_3:ZnO=1:1:1$ [mol %] or In:Ga:Zn=1:1:0.5 [at. %]) is given.

In addition, for example, in the case of a target for forming a conductive metal oxide film, as an example of a target material, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or any of the metal oxide materials containing silicon or silicon oxide can be used.

In addition, for example, in the case of a target for forming a metal film, a metal material such as Al, Cu, Cr, Ta, Ti, Mo, or W, or an alloy material containing the metal material as a component can be given as an example of a target material. Further, when an element for preventing a hillock or a whisker which is caused in an Al film such as Si, Ti, Ta, W, Mo, Cr, Nd, Sc, or Y is added to Al, heat resistance of the metal film can be improved.

When a conductive film which is used for a source electrode layer and a drain electrode layer of a transistor and in contact with an oxide semiconductor film is deposited, a metal in which the amount of an impurity is reduced as much as possible is used for a source material so that the impurity such as a hydrogen atom can be prevented from being diffused into the oxide semiconductor layer. In addition, a material containing a metal with high oxygen affinity, e.g., one or more materials selected from titanium (Ti), manganese (Mn), magnesium (Mg), zirconium, beryllium, and thorium, is preferable.

After the source material is processed into the shape of the sintered body 300, the sintered body is cleaned in a clean room when necessary so as not to generate particles.

The sintered body 300 which has been processed so as to be suitable for the deposition apparatus is subjected to heat treatment in a high-purity inert gas, whereby an impurity is removed therefrom. The temperature of the heat treatment is in such a range that the sintered body 300 is not changed in property and shape. This step corresponds to (B) heat treatment in FIG. 1.

In addition, during a period from (B) heat treatment to (D) sealing, the sintered body 300 is treated in a cleaned atmosphere such as a drying chamber so that an impurity in the air is not adsorbed onto the sintered body 300. Specifically, the sintered body 300 is treated in an atmosphere which does not contain an impurity (in which the dew point is less than or equal to −40° C., preferably less than or equal to −50° C.) with the use of a glove box, a dry room, or the like.

As a method for measuring a dew point, a method in which a change in electrostatic capacitance which is caused by water molecules adsorbed onto a porous insulator part is measured, or a method in which a change in light reflectance which is caused by condensation of moisture on a cooled mirror surface is measured may be used.

In the heat treatment, nitrogen can be only used when the sintered body 300 is not nitrided. When the sintered body 300 is an oxide, the heat treatment may be performed in an atmosphere to which highly purified oxygen is added so that oxygen deficiency is not generated. In addition, the heat treatment may be performed while the pressure is reduced in such a range that the composition of main components of the sintered body 300 is not changed.

Then, the sintered body 300 is fixed to a backing plate 320. The backing plate 320 has a shape for keeping the airtightness of the deposition apparatus and a mounting portion 321 which enables mounting on the deposition apparatus so that the sintered body 300 can be mounted on the deposition apparatus.

In the case where the temperature of the sintered body 300 is adjusted through the backing plate, the backing plate is preferably formed of a material with high thermal conductivity such as copper.

The sintered body 300 and the backing plate 320 can be attached to each other using a brazing material. Indium (In) is mainly used as the brazing material. Note that this step corresponds to (C) attachment in FIG. 1.

When the deposition is performed while heating the sintered body 300 at a temperature that is higher than the melting point of a brazing material, a brazing material is not used and the sintered body 300 may be fixed to the backing plate with a flange. Although the temperature range in which a brazing material can be used varies depending on the kind of brazing material, when the sintered body 300 is heated at 150° C. to over 300° C., the sintered body 300 may be fixed to the backing plate 320 with the use of a flange.

Next, the sintered body 300 is covered by a package 340 having a gas barrier property so as to be sealed. The package 340 used in this embodiment does not cover the mounting portion 321 which enables mounting of the backing plate 320 on the deposition apparatus and prevents exposure of the sintered body 300 to the air. An impurity containing a hydrogen atom such as moisture is removed from a space including the sintered body 300. Specifically, the dew point is set to be less than or equal to −40° C., preferably less than or equal to −50° C. This step corresponds to (D) sealing in FIG. 1.

As the package 340 having a gas barrier property, a metal plate, a metal foil, a polymer film obtained by evaporating an inorganic thin film, or the like can be used. Specifically, a SUS plate, an aluminum plate, an aluminum foil, an aluminum evaporated film, a silicon nitride evaporated film, a silicon oxide evaporated film, or the like can be used.

The space including the sintered body 300 which is covered by the package 340 may be filled with a high-purity inert gas. Further, the pressure inside the package 340 may be higher than the pressure of the outside. When the pressure inside the package is high, the outside air does not easily enter the space including the sintered body 300. In addition, a gas inlet may be provided for the package 340, and a container storing a high-purity inert gas whose pressure is higher than the atmospheric pressure may be connected thereto. Since the inside pressure can be maintained constant when the container is connected through a regulator, the outside air does not easily enter the inside of the package.

As the inert gas which fills the space including the sintered body 300 which is covered by the package 340, nitrogen or a rare gas such as helium, neon, or argon can be used. It is preferable that the inert gas do not contain an impurity (e.g., a substance containing a hydrogen atom such as water or hydrogen). It is preferable that the purity of nitrogen or a rare gas such as helium, neon, or argon which is introduced into a heat treatment apparatus be set to be greater than or equal to 6N (99.9999%), preferably greater than or equal to 7N (99.99999%) (that is, the impurity concentration is less than or equal to 1 ppm, preferably less than or equal to 0.1 ppm).

The pressure in the space including the sintered body 300 which is covered by the package 340 may be reduced. By reducing the pressure, the package 340 and the backing plate 320 can be attached to each other favorably, so that entry of the outside air can be prevented. In addition, an evacuation port may be provided for the package 340 so as to keep the inside of the package vacuum with the use of an evacuation device. By keeping the inside vacuum, a target material is not exposed to the outside air.

Furthermore, the sintered body 300, the backing plate 320, and the package 340 may be packed in a bag having a gas barrier property. By multiple packing, an impurity can be prevented from being adsorbed onto the sintered body 300, and further, particles can be prevented from entering the clean room with the sintered body 300.

The packaged sintered body 300 is transferred to the deposition apparatus. This step corresponds to (E) transfer in FIG. 1.

The sintered body 300 is mounted on a deposition chamber 400 of the deposition apparatus with the use of the mounting portion 321 of the backing plate 320. This step corresponds to (F) mounting in FIG. 1. The target material is mounted while being covered by the package and thus is not exposed to the air.

The deposition chamber 400 on which the sintered body 300 is mounted is evacuated. An impurity such as moisture of the air which is adsorbed onto the inner wall of the deposition chamber 400, the backing plate 320, and the package 340 is removed. The evacuation is performed until the dew point becomes at least less than or equal to −40° C., preferably less than or equal to −50° C. The deposition chamber 400 is heated as necessary so as to promote elimination of a substance adsorbed onto the deposition chamber 400. This step corresponds to (G) evacuation in FIG. 1.

It is preferable to provide a valve for removing a gas for the package 340 so that the pressure in the package 340 which is relatively increased in accordance with a reduction in pressure of the deposition chamber 400 is lowered.

Then, the package 340 which covers the sintered body 300 is detached. This step corresponds to (H) detachment in FIG. 1.

In the case where the package 340 is detached in the deposition chamber 400 in which the pressure is reduced, a detachment unit may be provided in the deposition chamber 400, and the package 340 may be detached. Further, in the case where the package 340 is detached in the deposition chamber 400 after the air in the deposition chamber 400 is removed and the deposition chamber 400 is filled with a high-purity inert gas at atmospheric pressure, the package 340 may be detached with the use of a glove provided for the deposition chamber 400.

With the above method, a target material in which adsorption and the amount of an impurity of the air (e.g., a compound containing a hydrogen atom) are reduced can be manufactured. In addition, a target material with a small amount of an impurity can be mounted on a deposition chamber without being exposed to the air and used. As a result, a thin film that is less contaminated with an impurity can be formed.

This embodiment can be combined with any of other embodiments in this specification as appropriate.

Embodiment 2

In this embodiment, a method will be described in more detail with reference to FIGS. 2A and 2B and FIGS. 3A to 3D-2, in which a target is mounted on a deposition apparatus, a deposition chamber is evacuated, and the target is unsealed by detaching a package from the target in the steps from manufacture of the target to detaching of the package which are described in Embodiment 1.

On a deposition chamber 400a illustrated in FIG. 2A, a sintered body 300 is mounted with the use of a backing plate 320. One of walls which surround the deposition chamber is provided with a glove 401, with which work can be conducted without exposing the inside of the deposition chamber to the air. Although not illustrated, the deposition chamber is provided with a unit for transferring a deposition substrate, a unit for supporting a deposition substrate, and an evacuation device which evacuates the deposition chamber.

In order to remove an impurity (a substance containing a hydrogen atom such as water or hydrogen) from the deposition chamber, the evacuation device is preferably a cryopump or a turbo pump provided with a cold trap.

In accordance with the description in Embodiment 1, after the sintered body 300 is mounted on the deposition chamber 400a with the use of the backing plate 320, the deposition chamber is evacuated. After the evacuation, the deposition chamber 400a is filled with a high-purity inert gas at atmospheric pressure, and then, a package 340 is detached using the glove 401.

A structure of a package for sealing a target material is described using an example. In the case of the package illustrated in FIG. 2A, for example, a fitting pin 325a may be provided for a backing plate 320a, and a package 340a may be provided with a fitting cut portion 345a and a pressure adjusting valve 335 as illustrated in FIG. 3A.

The fitting pin 325a is inserted into the fitting cut portion 345a, and they are rotated so as to be fitted to each other, whereby the package 340a can seal the sintered body 300. A packing or the like for enhancing airtightness is preferably provided in a portion where the package 340a is in contact with the backing plate 320a. Further, adhesive or the like may be used so as to enhance a sealing property. However, the adhesive could be a generation source of an impurity or a dust; therefore, a method in which physical pressure bonding of the package is performed by fitting so as to keep airtightness is preferable.

Alternatively, the backing plate and the package are attached to each other using a screw so as to seal the target material.

The pressure adjusting valve 335 is opened when the pressure in the space including the target material which is sealed by the package is higher than the outside pressure by, for example, 1 atm or more, whereby the inside pressure is not increased any more.

Next, an unsealing method that is different from FIG. 2A is described. On a deposition chamber 400b illustrated in FIG. 2B, a sintered body 300 is mounted with the use of a backing plate 320. In addition, a unit 405 for unsealing a target which moves the package 340 covering the sintered body 300 is provided. As in FIG. 2A, the deposition chamber 400b is provided with a unit for transferring a deposition substrate, a unit for supporting a deposition substrate, and an evacuation device which evacuates the deposition chamber, which are not illustrated.

In accordance with the description in Embodiment 1, after the sintered body 300 is mounted on the deposition chamber 400b with the use of the backing plate 320, the deposition chamber is evacuated. After the evacuation, the package 340 is moved and detached using the unit 405 for unsealing a target.

A structure suitable for the unit 405 for unsealing a target is described using an example. A package illustrated in FIGS. 3B-1 and 3B-2 can be detached by movement in one direction and a target can be unsealed.

Figures 1, 2, 10A, 10B:
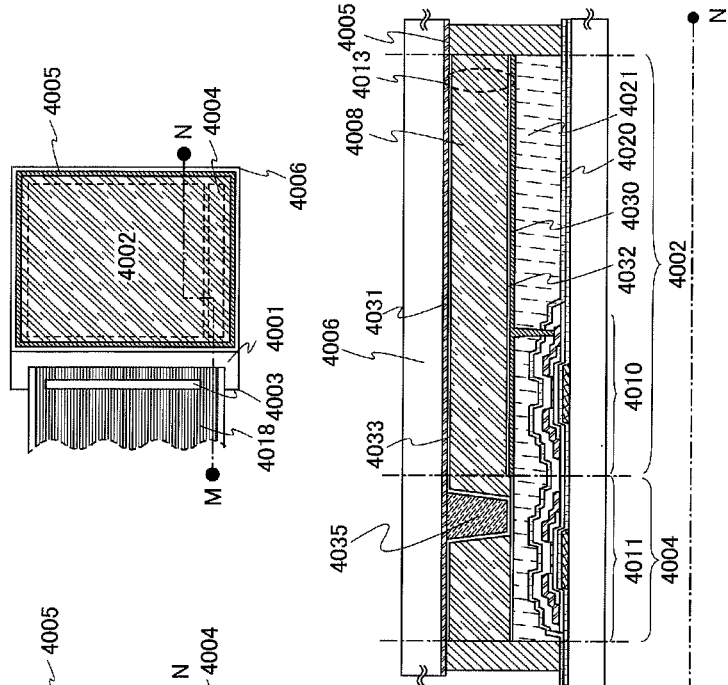

FIG. 3B-1 is a side view of a sintered body 300, a backing plate 320b, and a package 340b. FIG. 3B-2 is a side view from a direction of an arrow in FIG. 3B-1, illustrating a structure in which the package 340b is attached to and detached from the sintered body 300 and the backing plate 320b.

The backing plate 320b includes a fitting rail 325b, a sealing member 330, and a pressure adjusting valve 335, and the package 340b includes a slide member 345b. The slide member 345b is fitted to the fitting rail 325b, and the package 340b is moved freely in a direction of an arrow in FIG. 3B-2 until it comes into contact with the sealing member 330.

The slide member 345b and the fitting rail 325b are fitted to each other and the package 340b comes into contact with the sealing member 330, so that the sintered body 300 is sealed in the package 340b. A packing or the like for enhancing airtightness is preferably provided in a portion where the package 340b is in contact the backing plate 320b.

In accordance with the method illustrated in FIG. 3B-1, the target can be unsealed only by movement of the package 340b in one direction, and thus, the unit 405 for unsealing a target can be simpler.

Another structure suitable for the unit 405 for unsealing a target is described. With the use of a package illustrated in FIGS. 3C-1 and 3C-2, a target can be unsealed by movement in two directions.

FIG. 3C-1 is a side view of a sintered body 300, a backing plate 320c, and a package 340c. FIG. 3C-2 is a side view from a direction of an arrow in FIG. 3C-1, illustrating a structure in which the package 340c is attached to and detached from the sintered body 300 and the backing plate 320c.

The backing plate 320c includes a plurality of fitting rails 325c, a sealing member 330, and a pressure adjusting valve 335. The package 340c includes a plurality of slide members 345c. Each of the slide members 345c has a shorter length than that of the fitting rail 325c.

The slide members 345c and the fitting rails 325c are fitted to each other, and the package 340c is freely moved in a direction of an arrow in FIG. 3C-2 until it comes into contact with the sealing member 330. The backing plate 320c and the package 340c are placed in contact with each other by locating the slide members 345c in the fitting rails 325c. Then, the package 340c comes into contact with the sealing member 330, so that the sintered body 300 is sealed in the package 340c. A packing or the like for enhancing airtightness is preferably provided in a portion where the package 340c is in contact the backing plate 320c.

In accordance with the method illustrated in FIG. 3C-1, a distance of sliding of the package 340c is shorter than the length of the fitting rails 325c, so that the target can be easily unsealed.

Another structure suitable for the unit 405 for unsealing a target is described. With the use of a package illustrated in FIGS. 3D-1 and 3D-2, a target can be unsealed by movement in one direction.

FIG. 3D-1 is a side view of a sintered body 300, a backing plate 320d, and a package 340d. FIG. 3D-2 is a side view from a direction of an arrow in FIG. 3D-1, illustrating a structure in which the package 340d is attached to and detached from the sintered body 300 and the backing plate 320d.

The backing plate 320d includes a fitting rail 325d, a sealing member 330, and a pressure adjusting valve 335, and the package 340d includes a slide member 345d. The slide member 345d is fitted to the fitting rail 325d, and the package 340d is moved freely in a direction of an arrow in FIG. 3D-2 until it comes into contact with the sealing member 330.

The slide member 345d and the fitting rail 325d are fitted to each other, and the package 340d comes into contact with the sealing member 330, so that the sintered body 300 is sealed in the package 340d. A packing or the like for enhancing airtightness is preferably provided in a portion where the package 340d is in contact the backing plate 320d.

The backing plate 320d illustrated in FIG. 3D-1 can be easily processed.

With the above method, a target material with a small amount of an impurity can be mounted on a deposition chamber without being exposed to the air and used. As a result, a thin film that is less contaminated with an impurity can be deposited.

In addition, when a target material is sealed by using the backing plate including the fitting rail and the package including the slide member which are described in this embodiment, the target can be used in a deposition chamber provided with a unit for unsealing a target, whereby the package can be easily detached and the productivity can be improved.

This embodiment can be combined with any of other embodiments in this specification as appropriate.

Embodiment 3

In this embodiment, a method for manufacturing a semiconductor element with the use of a target to which any of the packaging methods described in Embodiments 1 and 2 is applied will be described. Note that in this embodiment, the structure of a thin film transistor illustrated in FIG. 4 as an example of the semiconductor element and a manufacturing method thereof will be described.

Figure 4:
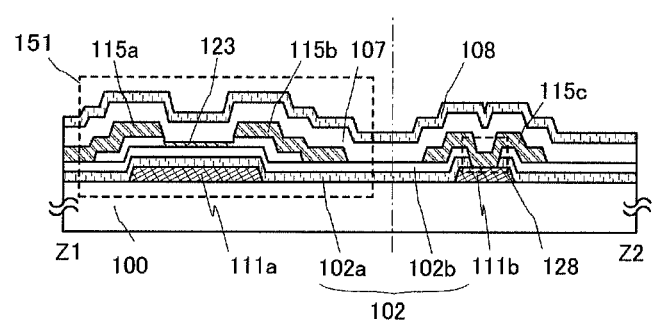
FIG. 4 illustrates a semiconductor device according to an embodiment.

FIG. 4 is a cross-sectional view illustrating a thin film transistor 151 of this embodiment. In the thin film transistor 151, a gate electrode 111a and a gate wiring layer 111b are formed over a substrate 100, and a gate insulating layer 102 is formed over the gate electrode 111a and the gate wiring layer 111b. The gate insulating layer 102 is a stack of a first gate insulating layer 102a and a second gate insulating layer 102b. An oxide semiconductor layer 123 is formed over the gate electrode 111a with the gate insulating layer 102 therebetween. A source electrode layer and a drain electrode layer (denoted by 115a and 115b) are formed in such a manner that end portions of the source layer and the drain electrode layer overlap with the gate electrode 111a. An oxide insulating film 107 is formed to be in contact with the oxide semiconductor layer 123 between the source electrode layer and the drain electrode layer (denoted by 115a and 115b) over the gate electrode 111a. A protective insulating layer 108 is formed over the oxide insulating film 107.

A contact hole 128 is formed in the gate insulating layer 102 to reach the gate wiring layer 111b. The gate wiring layer 111b and a second wiring layer 115c are connected to each other through the contact hole 128.

A method for manufacturing the thin film transistor 151 of this embodiment is described with reference to FIGS. 5A, 5B, 5C, and 5D. FIGS. 5A to 5D are cross-sectional views illustrating a method for manufacturing the thin film transistor of this embodiment.

In the case where the temperature at which heat treatment is performed is high, a glass substrate whose strain point is greater than or equal to 730° C. is preferably used as the substrate 100. As a glass substrate, a glass material such as aluminosilicate glass, aluminoborosilicate glass, or barium borosilicate glass is used, for example. By containing a larger amount of barium oxide (BaO) than boron oxide ($B_2O_3$), a more practical heat-resistant glass substrate is obtained. Therefore, a glass substrate containing BaO and $B_2O_3$ so that the amount of BaO is larger than that of $B_2O_3$ is preferably used.

Note that instead of the glass substrate described above, a substrate that is formed using an insulator, such as a ceramic substrate, a quartz substrate, or a sapphire substrate, may be used as the substrate 100. Alternatively, crystallized glass or the like may be used.

An insulating film serving as a base film may be formed between the substrate 100, and the gate electrode 111a and the gate wiring layer 111b, which are described below. The base film has a function of preventing diffusion of an impurity element from the substrate 100, and can be formed to have a single-layer structure or a layered structure using one or more of a silicon nitride film, a silicon oxide film, a silicon nitride oxide film, and a silicon oxynitride film.

After formation of a conductive film over the substrate 100 having an insulating surface, a first wiring layer including the gate electrode 111a and the gate wiring layer 111b is formed through a first photolithography step. Note that the end portions of the gate electrode that is formed are preferably tapered.

Note that a resist mask may be formed by an ink-jet method. Formation of the resist mask by an ink-jet method needs no photomask; thus, manufacturing cost can be reduced.

As the conductive film for forming the gate electrode 111a and the gate wiring layer 111b, an element selected from Al, Cr, Ta, Ti, Mo, and W, an alloy containing any of these elements as a main component, an alloy containing any of these elements in combination, or the like can be used. In addition, the conductive film can be a single layer or a stack formed using a metal material such as copper, neodymium, or scandium, or an alloy material containing any of these materials as a main component, in addition to the above metal. Note that the gate electrode can be formed using a light-transmitting conductive film. As the light-transmitting conductive film, a transparent conductive oxide or the like can be used, for example.

Next, the gate insulating layer 102 is formed. As the gate insulating layer 102, a single-layer structure or a layered structure using one or more of a silicon oxide layer, a silicon oxynitride layer, a silicon nitride oxide layer, a silicon nitride layer, an aluminum oxide layer, a tantalum oxide layer, and the like can be used. The gate insulating layer 102 is formed to a thickness of 50 nm to 250 nm inclusive by a CVD method, a sputtering method, or the like. Note that the film may be doped with phosphorus (P) or boron (B).

An oxide insulating layer is preferably formed on a side of the gate insulating layer 102, which is in contact with the oxide semiconductor layer. In this embodiment, silicon nitride is used for the first gate insulating layer 102$a$ and silicon oxide is used for the second gate insulating layer 102$b$. An i-type or substantially i-type oxide semiconductor achieved by removal of impurities (a highly purified oxide semiconductor) which is used in this embodiment is extremely sensitive to interface state density and interface charge. Therefore, an interface with an insulating film is important. Accordingly, an insulating film which is in contact with a highly purified oxide semiconductor is required to have high quality.

For example, a high-density plasma CVD method with the use of microwaves (2.45 GHz), by which a dense and high-quality insulating film having high withstand voltage can be formed, is preferable. This is because an interface state can be reduced and interface characteristics can be favorable when the highly purified oxide semiconductor and the high-quality gate insulating film are in contact with each other.

In addition, since an insulating film formed by using a high-density plasma CVD apparatus can have a uniform thickness, the insulating film has excellent step coverage. Further, the thickness of a thin insulating film formed by using a high-density plasma CVD apparatus can be controlled precisely.

Needless to say, other methods such as a sputtering method and a plasma CVD method can be employed as long as an insulating film having good quality as a gate insulating film can be formed. Alternatively, an insulating film whose film quality as a gate insulating film and interface characteristics with an oxide semiconductor are improved by heat treatment after film deposition may be used. Any insulating film can be used as long as film quality as a gate insulating film is high, interface state density with an oxide semiconductor is decreased, and a favorable interface can be formed.

The gate insulating layer 102 is formed using a high-density plasma CVD apparatus. Here, a high-density plasma CVD apparatus refers to an apparatus which can realize a plasma density of greater than or equal to $1 \times 10^{11}/cm^3$. For example, plasma is generated by applying a microwave power of 3 kW to 6 kW so that the insulating film is formed.

A monosilane gas ($SiH_4$), nitrous oxide ($N_2O$), and a rare gas are introduced into a chamber as a source gas to generate high-density plasma at a pressure of 10 Pa to 30 Pa, and an insulating film is formed over a substrate having an insulating surface, such as a glass substrate. After that, the supply of a monosilane gas is stopped, and nitrous oxide ($N_2O$) and a rare gas are introduced without exposure to the air, so that plasma treatment may be performed on a surface of the insulating film. The plasma treatment performed on the surface of the insulating film by introducing at least nitrous oxide ($N_2O$) and a rare gas is performed after the insulating film is formed. The insulating film formed through the above process procedure has a small thickness and is an insulating film whose reliability can be ensured even though it has a thickness of less than 100 nm, for example.

In forming the gate insulating layer 102, the flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

In addition, since the insulating film formed by using a high-density plasma CVD apparatus can have a uniform thickness, the insulating film has excellent step coverage. Further, the thickness of a thin insulating film formed by using a high-density plasma CVD apparatus can be controlled precisely.

The insulating film formed through the above process procedure is greatly different from an insulating film formed using a conventional parallel plate plasma CVD apparatus. When the etching rates are compared in the case of using the same etchant, the etching rate of the insulating film formed through the above process procedure is lower than that of the insulating film formed using a conventional parallel plate plasma CVD apparatus by 10% or more or 20% or more. Thus, it can be said that the insulating film formed using a high-density plasma apparatus is a dense film.

Alternatively, the gate insulating layer 102 can be formed using a silicon oxide layer by a CVD method with the use of an organosilane gas. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

Further alternatively, the gate insulating layer 102 may be formed using one of oxide, nitride, oxynitride, and nitride oxide of aluminum, yttrium, or hafnium; or a compound including at least two or more of the above.

Further, the gate insulating layer 102 and an oxide semiconductor layer 103 may be formed successively. For example, when a multi-chamber sputtering apparatus provided with a target material of silicon or silicon oxide (artificial quartz) and a target material for an oxide semiconductor film is used, successive film formation can be performed without the formed gate insulating layer 102 being exposed to the air.

The oxide semiconductor film is formed over the gate insulating layer 102. As the oxide semiconductor film, any of the following oxide semiconductor films can be used: a four-component-based metal oxide film such as an In—Sn—Ga—Zn—O film, a three-component-based metal oxide film such as an In—Ga—Zn—O film, an In—Sn—Zn—O film, an In—Al—Zn—O film, a Sn—Ga—Zn—O film, an Al—Ga—Zn—O film, or a Sn—Al—Zn—O film, a two-component-based metal oxide film such as an In—Zn—O film, a Sn—Zn—O film, an Al—Zn—O film, a Zn—Mg—O film, a Sn—Mg—O film, an In—Mg—O film, or an In—Ga—O film, and a film such as an In—O film, a Sn—O film, or a Zn—O film. In addition, the above oxide semiconductor film may contain $SiO_2$.

As the oxide semiconductor film, a thin film of a material represented by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like. An oxide semiconductor whose composition formula is represented by $InMO_3(ZnO)_m$ (m>0) where Ga is contained as M is referred to as the above In—Ga—Zn—O based oxide semiconductor, and a thin film thereof is referred to as an In—Ga—Zn—O film.

The oxide semiconductor film preferably has a thickness of 5 nm to 30 nm inclusive. Note that an appropriate thickness differs depending on an oxide semiconductor material, and the thickness may be set as appropriate depending on the material.

The oxide semiconductor film is formed by a sputtering method using a target which is formed by the method described in Embodiment 1 or 2. The oxide semiconductor film formed using the target contains a small amount of an impurity of the air (such as a compound containing a hydrogen atom). For example, the hydrogen concentration is less than or equal to $5\times10^{19}$ cm$^{-3}$, preferably less than or equal to $5\times10^{18}$ cm$^{-3}$, more preferably less than or equal to $5\times10^{17}$ cm$^{-3}$, still more preferably less than $1\times10^{16}$ cm$^{-3}$.

In this embodiment, as the target material, an oxide semiconductor containing In, Ga, and Zn (composition ratio of $In_2O_3$:$Ga_2O_3$:ZnO=1:1:1 [mol %] or In:Ga:Zn=1:1:0.5 [at. %]) is used to form an In—Ga—Zn—O-based film. Note that the distance between the substrate and the target material is 100 mm, for example.

Note that a deposition chamber where the oxide semiconductor film is formed is provided with a cryopump as an evacuation unit. The evacuation unit may be a turbo pump provided with a cold trap.

When the deposition chamber is evacuated with a cryopump or a turbo pump provided with a cold trap, for example, a compound containing a hydrogen atom such as $H_2O$ or a compound containing a carbon atom can be removed. In this embodiment, an impurity eliminated from the target material due to heating can be removed, which is particularly effective.

Further, the oxide semiconductor film can be deposited by a sputtering method in a rare gas (typically argon) atmosphere, an oxygen atmosphere, or an atmosphere containing a rare gas (typically argon) and oxygen. In this embodiment, film formation is performed with oxygen (the oxygen flow percentage is 100%) as a sputtering gas under a pressure of 0.6 Pa.

Examples of a sputtering method to which a target according to an embodiment of the present invention can be applied include an RF sputtering method in which a high-frequency power source is used as a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal conductive film.

In addition, there are a sputtering apparatus provided with a magnet system inside a chamber and used for a magnetron sputtering method, and a sputtering apparatus used for an ECR sputtering method in which plasma generated with the use of microwaves is used without using glow discharge.

Furthermore, as a deposition method using a sputtering method, there are also a reactive sputtering method in which a target material and a sputtering gas component are chemically reacted with each other during deposition to form a thin compound film thereof, and a bias sputtering in which a voltage is also applied to a substrate during deposition.

In addition, there is a multi-source sputtering method in which a plurality of target materials of different materials can be used. With a multi-source sputtering method, films of different materials can be formed to be stacked in the same chamber, or a mixture of plural kinds of materials can be formed by sputtering at the same time in the same chamber.

In this embodiment, a direct current (DC) power source of 0.5 kW is used as a power source. Note that a pulse direct current (DC) power source is preferable because dust can be reduced and the film thickness can be uniform.

In the oxide semiconductor film formed by using a target which is packaged by the method described in Embodiment 1 or 2, the amount of a compound containing a hydrogen atom such as $H_2O$, a compound containing a carbon atom, or an impurity such as a hydrogen atom or a carbon atom is small. For example, according to a technical idea of the present invention, an oxide semiconductor film which has an ideal hydrogen concentration of zero or close to zero can be formed.

Note that after an oxide semiconductor layer is formed, the oxide semiconductor layer may be subjected to first heat treatment. Detailed description of the first heat treatment is made after description of a series of steps of manufacturing a thin film transistor.

Note that before the oxide semiconductor film is formed, dust attached to a surface of the gate insulating layer 102 is preferably removed by reverse sputtering in which an argon gas is introduced to a sputtering apparatus and plasma is generated. The reverse sputtering refers to a method in which, in an argon atmosphere, an RF power source is used for application of voltage to a substrate side to generate plasma around the substrate and to modify a surface. Note that instead of an argon atmosphere, a nitrogen atmosphere, a helium atmosphere, an oxygen atmosphere, or the like may be used.

Next, the oxide semiconductor layer 103 is processed into an island shape through a second photolithography step, whereby an oxide semiconductor layer 113 is formed.

Note that a resist mask for forming the island-shaped oxide semiconductor layer may be formed by an ink-jet method. Formation of the resist mask by an ink-jet method needs no photomask; thus, manufacturing cost can be reduced.

Figure 5A:
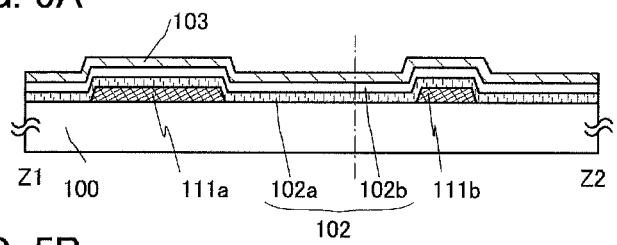
FIGS. 5A to 5D illustrate a method for manufacturing the semiconductor device according to an embodiment.
Figure 5B:
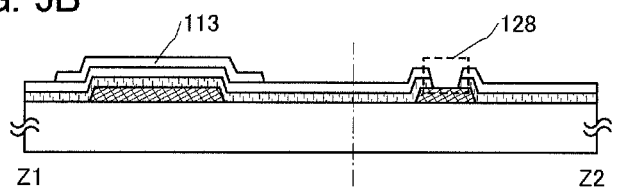

Then, the contact hole 128 is formed in the gate insulating layer 102 through a third photolithography step. Note that it is preferable that reverse sputtering be performed before formation of a conductive film in the subsequent step, so that a resist residue or the like attached to the surfaces of the oxide semiconductor layer and the gate insulating layer 102 is removed. A cross-sectional view at this stage is illustrated in FIG. 5B.

Although the gate insulating layer is selectively etched for formation of the contact hole 128 which reaches the gate wiring layer 111*b* through the third photolithography step in this embodiment, there is no limitation to this method. After the oxide semiconductor film is formed, a resist mask may be formed over the oxide semiconductor film, and a contact hole reaching the gate electrode 111*a* may be formed. After the contact hole is formed, the process may proceed as follows: removing the resist mask, forming a resist mask over the oxide semiconductor film using another photomask, and processing the oxide semiconductor film into an island-shaped oxide semiconductor layer by selective etching.

Next, a conductive film for forming the source electrode layer and the drain electrode layer of the thin film transistor is formed over the gate insulating layer 102, the oxide semiconductor layer 113, and the gate wiring layer 111*b* through the contact hole 128.

The conductive film for forming the source electrode layer and the drain electrode layer can be formed by a sputtering method with the use of a target which is packaged by the method described in Embodiment 1 or 2.

As the conductive film for forming the source electrode layer and the drain electrode layer (including a wiring formed using the same layer), a metal material such as Al, Cu, Cr, Ta, Ti, Mo, or W, or an alloy material containing the metal material as a component is used. Further, a structure may be employed in which a film of a high-melting point metal such as Cr, Ta, Ti, Mo, or W is stacked over/under one of or both sides of a metal film such as Al or Cu. Furthermore, an Al material to which an element which prevents generation of hillocks or whisker in an Al film, such as Si, Ti, Ta, W, Mo, Cr, Nd, Sc, or Y is added may be used, leading to an improvement in heat resistance.

The source electrode layer and the drain electrode layer (including the wiring formed using the same layer) may be formed using a conductive metal oxide film. As the conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or any of the metal oxide materials containing silicon or silicon oxide can be used.

For the conductive film which is in contact with the oxide semiconductor layer 113, a material containing a metal with high oxygen affinity is preferable. As the metal with high oxygen affinity, one or more materials selected from titanium (Ti), manganese (Mn), magnesium (Mg), zirconium, beryllium, and thorium are preferable. In this embodiment, a three-layer conductive film in which a titanium film (with a thickness of 100 nm), an aluminum film (with a thickness of 200 nm), and a titanium film (with a thickness of 100 nm) are stacked is formed. Instead of a Ti film, a titanium nitride film may be used.

Note that in the case of performing heat treatment at 200° C. to 600° C., the conductive film preferably has heat resistance so as to be able to withstand this heat treatment. For example, it is preferable to use an aluminum alloy to which a hillock preventing element is added, or a conductive film over which a heat-resistance conductive film is stacked. Note that as a method for forming the conductive film, a sputtering method, a vacuum evaporation method (an electron beam evaporation method or the like), an arc discharge ion plating method, or a spray method is used. Alternatively, the conductive film may be formed by discharging a conductive nanopaste of silver, gold, copper, or the like by a screen printing method, an ink-jet method, or the like and baking the nanopaste.

Figure 5C:
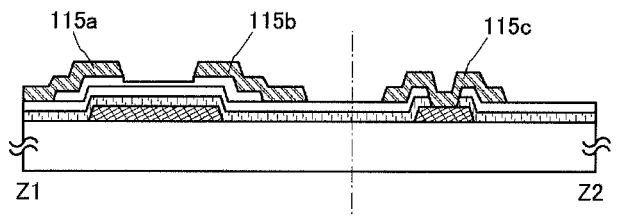

Next, through a fourth photolithography step, a resist mask is formed and the conductive film is selectively etched, so that the second wiring layer (denoted by 115a, 115b, and 115c) including the source electrode layer and the drain electrode layer is formed (see FIG. 5C). As illustrated in FIG. 5C, the second wiring layer 115c is directly connected to the gate wiring layer 111b through the contact hole 128.

In the fourth photolithography step, only a portion of the conductive film which is in contact with the oxide semiconductor layer is selectively removed. When an ammonia peroxide mixture (at a composition weight ratio of hydrogen peroxide:ammonia:water=5:2:2) or the like is used as an alkaline etchant in order to selectively remove only a portion of the conductive film which is on and in contact with the oxide semiconductor layer, the conductive film can be selectively removed and the oxide semiconductor layer containing an In—Ga—Zn—O-based oxide semiconductor can be left remaining.

Further, an exposed region of the oxide semiconductor layer is etched by the fourth photolithography step in some cases, depending on the etching condition. In that case, the thickness of the oxide semiconductor layer in a region interposed between the source electrode layer and the drain electrode layer (a region interposed between reference numerals 115a and 115b) is smaller than the thickness of the oxide semiconductor layer in a region overlapping with the source electrode layer over the gate electrode 111a or the thickness of the oxide semiconductor layer in a region overlapping with the drain electrode layer over the gate electrode 111a (see FIG. 5C).

Note that the resist mask for forming the second wiring layer (denoted by 115a, 115b, and 115c) including the source electrode layer and the drain electrode layer may be formed by an ink-jet method. Formation of the resist mask by an ink-jet method needs no photomask; thus, manufacturing cost can be reduced.

Next, the oxide insulating film 107 is formed over the gate insulating layer 102 and the oxide semiconductor layer 113. In this stage, a region where the oxide insulating film 107 is in contact with the oxide semiconductor layer is formed. The region of the oxide semiconductor layer which is interposed between and in contact with the oxide insulating film 107 and the gate insulating layer 102 over the gate electrode 111a is a channel formation region.

The oxide insulating film which is in contact with the oxide semiconductor layer with a smaller amount of impurities such as a compound containing a hydrogen atom such as $H_2O$, a compound containing a carbon atom, a hydrogen atom, or a carbon atom does not contain an impurity such as moisture, a hydrogen ion, or OH⁻ and prevents these impurities from entering from the outside. Typically, a silicon oxide film, a silicon nitride oxide film, an aluminum oxide film, an aluminum oxynitride film, or the like is used. The oxide insulating film 107 can be formed with a thickness of at least 1 nm by a method with which impurities such as water or hydrogen do not enter the oxide insulating film 107, such as a sputtering method, as appropriate.

In this embodiment, a silicon oxide film is formed as the oxide insulating film 107 by a sputtering method. The substrate temperature at the time of film formation may be room temperature to 600° C. inclusive, preferably 200° C. to 400° C. inclusive. In this embodiment, the substrate temperature is set to 100° C. The formation of the silicon oxide film by a sputtering method can be performed in a rare gas (typically, argon) atmosphere, an oxygen atmosphere, or an atmosphere containing a rare gas (typically, argon) and oxygen. Note that an oxide insulating film formed by a sputtering method is particularly dense and even a single layer thereof can be used as a protective film for suppressing diffusion of impurities into a layer in contact with the oxide insulating film. In addition, phosphorus (P) or boron (B) can be added to the oxide insulating film by using a target material doped with phosphorus (P) or boron (B).

As a target material for a sputtering method, a silicon oxide or a silicon can be used, and particularly, a silicon is preferable. A silicon oxide film formed by a sputtering method in an atmosphere containing oxygen and a rare gas with the use of a silicon includes a large number of dangling bonds of silicon atoms or oxygen atoms.

Since the oxide insulating film 107 contains a large number of dangling bonds, impurities contained in the oxide semiconductor layer 113 are more likely to diffuse into the oxide insulating film 107 through the interface at which the oxide semiconductor layer 113 and the oxide insulating film 107 are in contact with each other. Specifically, a hydrogen atom, a compound containing a hydrogen atom such as $H_2O$, or the like in the oxide semiconductor layer 113 is more likely to diffuse into the oxide insulating film 107.

In this embodiment, the film deposition is performed by a pulsed DC sputtering method using a columnar polycrystalline silicon target material doped with boron which has a purity of 6N (the resistivity is 0.01 Ωcm) under the following condition: the distance between the substrate and a sintered body including the target material (T-S distance) is 89 mm, the pressure is 0.4 Pa, the direct-current (DC) power is 6 kW, and an oxygen atmosphere (the oxygen flow percentage is 100%) is used. The film thickness is 300 nm.

Note that the oxide insulating film 107 is provided on and in contact with a region serving as the channel formation region of the oxide semiconductor layer, and functions as a channel protective layer.

Figure 5D:
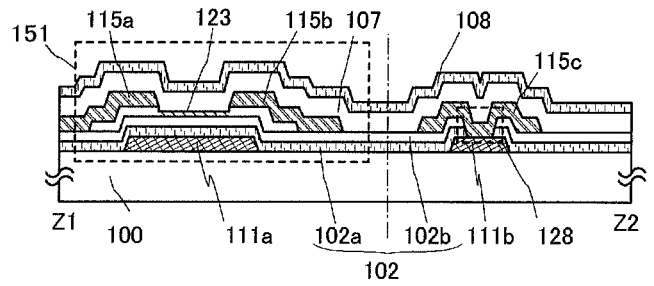

Next, the protective insulating layer 108 is formed over the oxide insulating film 107 (see FIG. 5D). As the protective insulating layer 108, a silicon nitride film, a silicon nitride oxide film, an aluminum nitride film, or the like is used. In this embodiment, a silicon nitride film is formed as the protective insulating layer 108 by an RF sputtering method.

After formation of the oxide insulating film 107, second heat treatment (preferably at a temperature of 200° C. to 400° C. inclusive, for example, 250° C. to 350° C. inclusive) may be performed in an inert gas atmosphere or a nitrogen gas atmosphere.

For example, the second heat treatment is performed in a nitrogen atmosphere at 250° C. for one hour. Through the second heat treatment, heating is performed in a state where part of the oxide semiconductor layer 113 is in contact with the oxide insulating film 107 and other parts of the oxide semiconductor layer 113 are in contact with the second wiring layer (denoted by 115a and 115b).

When the second heat treatment is performed in the state where the oxide semiconductor layer 113 is in contact with the oxide insulating film 107, the resistance of a region of the oxide semiconductor layer 113 which is in contact with the oxide insulating film 107 is increased, that is, the region becomes i-type.

Since the oxide semiconductor layer whose resistance is increased (the i-type oxide semiconductor layer) is formed in the channel formation region of the thin film transistor 151, the threshold voltage is positive and the thin film transistor 151 behaves as an enhancement-type thin film transistor.

In the case where a metal conductive film with high oxygen affinity is in contact with the oxide semiconductor layer, oxygen tends to move to the metal conductive film side by performing heat treatment and the oxide semiconductor layer comes to have n-type conductivity. Accordingly, by performing the second heat treatment, regions in the oxide semiconductor layer 113, which are in contact with the source electrode layer and the drain electrode layer (denoted by 115a and 115b) formed using a metal conductive film with high oxygen affinity, such as titanium, come to have n-type conductivity.

The timing of the second heat treatment is not limited to the timing shortly after the fourth photolithography step as long as it is after the fourth photolithography step.

Through the above-described steps, the thin film transistor 151 can be manufactured.

Although the gate insulating layer is selectively etched for formation of the contact hole 128 which reaches the gate wiring layer 111b through the third photolithography step in this embodiment, there is no limitation to this method. For example, after formation of the gate insulating layer 102, a resist mask may be formed over the gate insulating layer and the contact hole which reaches the gate wiring layer 111b may be formed.

The concentration of an impurity remaining in the oxide semiconductor layer, typically the hydrogen concentration, is ideally zero or close to zero according to a technical idea of the present invention. When the concentration of hydrogen remaining in the oxide semiconductor layer needs to be further lowered after formation of the oxide semiconductor layer, the first heat treatment may be performed for dehydration or dehydrogenation.

The first heat treatment for dehydration or dehydrogenation is performed at a temperature of greater than or equal to 400° C. and less than 750° C., preferably, greater than or equal to 425° C. Note that in the case of the temperature that is greater than or equal to 425° C., the heat treatment time may be one hour or shorter, whereas in the case of the temperature that is less than 425° C., the heat treatment time is longer than one hour. In the first heat treatment, the substrate is introduced into an electric furnace, which is one of heat treatment apparatuses, and heat treatment is performed on the oxide semiconductor layer in a nitrogen atmosphere. Then, the oxide semiconductor layer is not exposed to the air, which prevents water or hydrogen from entering the oxide semiconductor layer; thus, an oxide semiconductor layer which is dehydrated or dehydrogenated is obtained. Slow cooling is performed in a nitrogen atmosphere in one furnace from the heating temperature T at which the oxide semiconductor layer is dehydrated or dehydrogenated to a temperature low enough to prevent water from entering, specifically to a temperature lower than the heating temperature T by 100° C. or more. Without being limited to a nitrogen atmosphere, dehydration or dehydrogenation is performed in an atmosphere of helium, neon, argon, or the like.

The heat treatment apparatus is not limited to the electric furnace, and for example, may be an RTA (rapid thermal annealing) apparatus such as a GRTA (gas rapid thermal annealing) apparatus or an LRTA (lamp rapid thermal annealing) apparatus. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object to be processed by radiation of heat using light emitted from the above-described lamp and by conduction of heat from a gas heated by light emitted from the lamp. As the gas, an inert gas which does not react with an object to be processed by heat treatment, such as nitrogen or a rare gas such as argon is used. An LRTA apparatus or a GRTA apparatus may include not only a lamp but also a device for heating an object to be processed by heat conduction or heat radiation from a heater such as a resistance heater.

In addition, in the first heat treatment, it is preferable that nitrogen or a rare gas such as helium, neon, or argon do not contain water, hydrogen, or the like. It is preferable that the purity of nitrogen or a rare gas such as helium, neon, or argon which is introduced into the heat treatment apparatus be set to greater than or equal to 6N (99.9999%), preferably greater than or equal to 7N (99.99999%) (that is, the impurity concentration is less than or equal to 1 ppm, preferably less than or equal to 0.1 ppm).

Note that the oxide semiconductor layer may be crystallized to be a microcrystalline film or a polycrystalline film depending on the condition of the first heat treatment or the material of the oxide semiconductor layer. For example, the oxide semiconductor layer may be crystallized to become a microcrystalline oxide semiconductor film having a degree of crystallinity of greater than or equal to 90%, or greater than or equal to 80%. Alternatively, depending on the condition of the first heat treatment or the material of the oxide semiconductor layer, the oxide semiconductor layer might become an amorphous oxide semiconductor film containing no crystalline component.

Through the first heat treatment, the oxide semiconductor layer is changed to an oxygen-deficient and low resistance oxide semiconductor layer. The carrier concentration of the oxide semiconductor layer after the first heat treatment is higher than that of the oxide semiconductor film just after the film formation; accordingly, the oxide semiconductor layer has a carrier concentration of greater than or equal to $1 \times 10^{18}$/ cm$^3$. Therefore, when the first heat treatment is performed, second heat treatment (preferably at 200° C. to 400° C. inclusive, for example, 250° C. to 350° C. inclusive) is performed in an inert gas atmosphere or a nitrogen gas atmosphere.

Note that depending on the condition of the first heat treatment or the material of the gate electrode 111a and the gate wiring layer 111b, the gate electrode 111a and the gate wiring layer 111b are crystallized to be a microcrystalline film or a polycrystalline film in some cases. For example, in the case where a film of an alloy of indium oxide and tin oxide is used for the gate electrode 111a and the gate wiring layer 111b, the gate electrode 111a and the gate wiring layer 111b are crystallized by the first heat treatment at 450° C. for one hour. In contrast, in the case where a film of an alloy of indium oxide and tin oxide which contains silicon oxide is used for the gate electrode 111a and the gate wiring layer 111b, the gate electrode 111a and the gate wiring layer 111b are not crystallized.

The first heat treatment for the oxide semiconductor layer can be performed before the oxide semiconductor film is processed into the island-shaped oxide semiconductor layer. In that case, the substrate is taken out of the heat treatment apparatus after the first heat treatment; then, the fourth photolithography step is performed.

Figure 21:
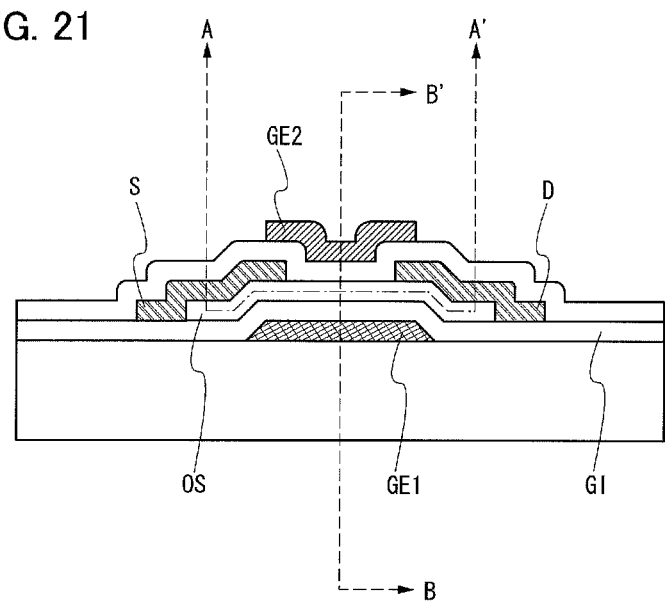
FIG. 21 is a longitudinal cross-sectional view of an inverted staggered transistor which includes an oxide semiconductor.

FIG. 21 is a longitudinal cross-sectional view of an inverted staggered thin film transistor in which an oxide semiconductor is used. An oxide semiconductor layer (OS) is provided over a gate electrode (GE1) with a gate insulating film (GI) therebetween, and a source electrode (S) and a drain electrode (D) are provided thereover. Further, a back gate (GE2) is provided over the source electrode and the drain electrode with an insulating layer therebetween.

Figure 22A:
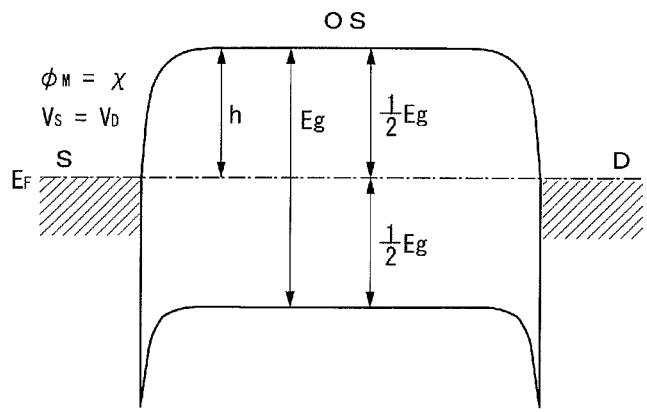
FIGS. 22A and 22B are energy band diagrams (schematic diagrams) of a cross section along A-A' in FIG. 21.
Figure 22B:
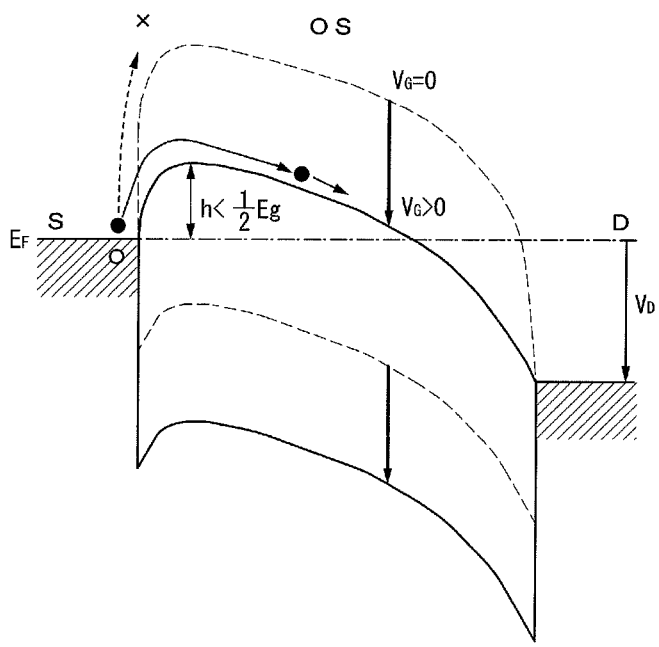

FIGS. 22A and 22B are energy band diagrams (schematic diagrams) of a cross section along A-A' in FIG. 21. FIG. 22A illustrates the case where the potential of a voltage applied to the source is equal to the potential of a voltage applied to the drain ($V_D$=0 V), and FIG. 22B illustrates the case where a positive potential with respect to the source is applied to the drain ($V_D$>0).

Figure 23:
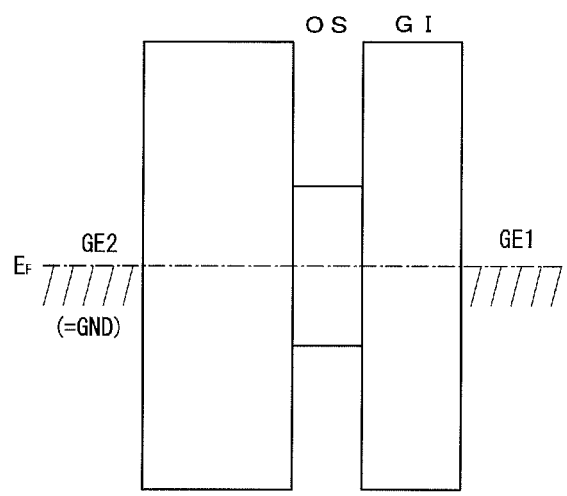
FIG. 23 is an energy band diagram of a cross section along B-B' in FIG. 21.
Figure 24A:
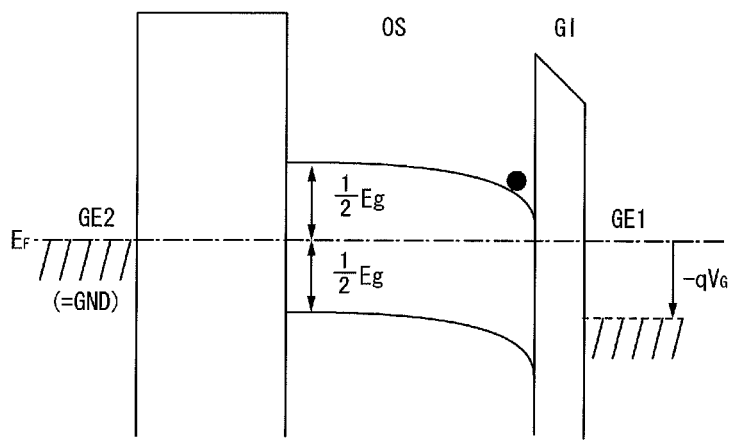
FIG. 24A illustrates a state where a positive potential ($V_G>0$) is applied to a gate (GE1)
Figure 24B:
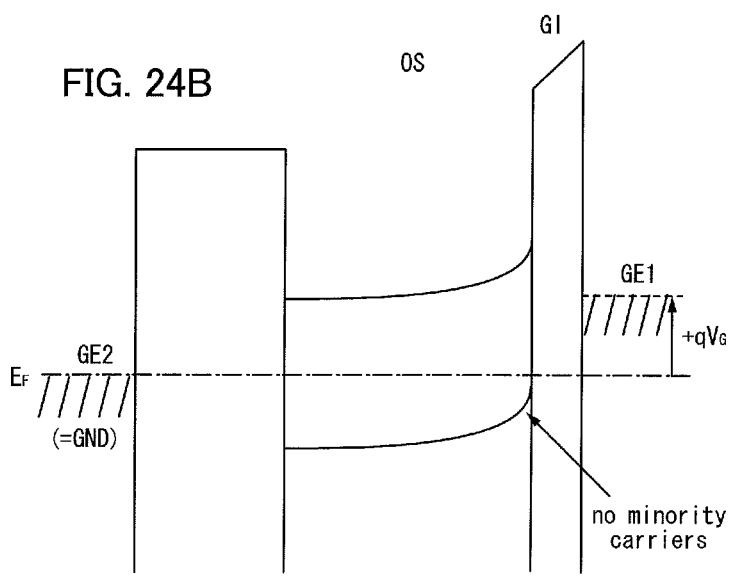
FIG. 24B illustrates a state where a negative potential ($V_G<0$) is applied to the gate (GE1) in a cross section along B-B' in FIG. 21.

FIG. 23 and FIGS. 24A and 24B are energy band diagrams (schematic diagrams) of a cross section along B-B' in FIG. 21. FIG. 23 shows the case where the gate voltage is 0 V. FIG. 24A illustrates an on state in which a positive potential ($V_G$>0) is applied to the gate (GE1) and carriers (electrons) flow between the source and the drain. FIG. 24B illustrates an off state in which a negative potential ($V_G$<0) is applied to the gate (GE1) and minority carriers do not flow. In the state where the oxide semiconductor has a thickness of approximately 50 nm and has a donor concentration of less than or equal to 1×10$^{18}$/cm$^3$ by being highly purified, a depletion layer expands to the entire oxide semiconductor in the off state. That is, the transistor can be regarded as a complete depletion transistor.

Figure 25:
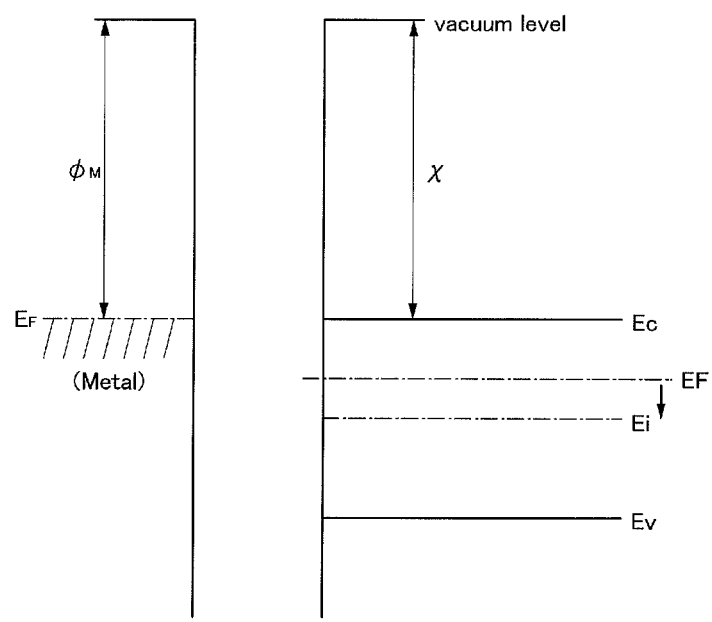
FIG. 25 illustrates relations between the vacuum level and a work function ($\phi M$) of a metal and between the vacuum level and electron affinity ($\chi$) of an oxide semiconductor of a cross section along B-B' in FIG. 21.

FIG. 25 shows the relations between the vacuum level and the work function of a metal ($\phi_M$) and between the vacuum level and the electron affinity ($\chi$) of an oxide semiconductor.

Since energy levels of a metal degenerate, a Fermi level exists in the conduction band. On the other hand, a conventional oxide semiconductor is an n-type semiconductor, in which case the Fermi level ($E_F$) is away from the intrinsic Fermi level (Ei) located in the middle of a band gap and is located closer to the conduction band. Note that it is known that some hydrogen in the oxide semiconductor forms a donor and might be a factor that causes an oxide semiconductor to be an n-type oxide semiconductor.

On the other hand, an oxide semiconductor of the present invention is an intrinsic (i-type) or a substantially intrinsic oxide semiconductor which is obtained by removing hydrogen that is an n-type impurity from an oxide semiconductor and highly purifying the oxide semiconductor so that an impurity other than the main component of the oxide semiconductor is prevented from being contained therein as much as possible. In other words, a feature is that a highly purified i-type (intrinsic) oxide semiconductor, or an oxide semiconductor close thereto, is obtained not by adding an impurity but by removing an impurity such as hydrogen or water as much as possible. This enables the Fermi level ($E_f$) to be at the same level as the intrinsic Fermi level (Ei).

In the case where the band gap (Eg) of an oxide semiconductor is 3.15 eV, its electron affinity ($\chi$) is said to be 4.3 eV. The work function of titanium (Ti) included in the source electrode and the drain electrode is substantially equal to the electron affinity ($\chi$) of the oxide semiconductor. In that case, a Schottky barrier against electrons is not formed at an interface between the metal and the oxide semiconductor.

In other words, in the case where the work function ($\phi_M$) of a metal and the electron affinity ($\chi$) of the oxide semiconductor are equal to each other and the metal and the oxide semiconductor are in contact with each other, an energy band diagram (a schematic diagram) as illustrated in FIG. 22A is obtained.

In FIG. 22B, a black circle (●) represents an electron. In FIG. 22B, a dashed line indicates movement of the electrons when a voltage is not applied to a gate ($V_G$=0) in the state where a positive voltage is applied to a drain ($V_D$>0), and a solid line indicates movement of the electrons when a positive voltage is applied to a gate ($V_G$>0) in the state where a positive voltage is applied to a drain ($V_D$>0). In the case where a positive voltage ($V_G$>0) is applied to the gate, by applying a positive voltage to the drain, electrons are injected into the oxide semiconductor over a barrier (h) and flow toward the drain. In that case, the height of the barrier (h) changes depending on the gate voltage and the drain voltage; in the case where a positive voltage is applied to the gate ($V_G$>0) and a positive drain voltage is applied, the height of the barrier (h) is smaller than the height of the barrier in FIG. 22A where no voltage is applied, i.e., ½ of the band gap ($E_g$). In the case where a voltage is not applied to the gate, a carrier (electron) is not injected to the oxide semiconductor side from an electrode because of a high potential barrier, so that a current does not flow, which means an off state. On the other hand, when positive voltage is applied to the gate, a potential barrier is reduced, so that current flows, which means an on state.

The electron injected into the oxide semiconductor at this time flows through the oxide semiconductor as illustrated in FIG. 24A.

In addition, in FIG. 24B, when a negative potential is applied to the gate electrode (GE1), the value of current is extremely close to zero because holes that are minority carriers are substantially zero.

As described above, the oxide semiconductor is made to be an intrinsic (i-type) or substantially intrinsic oxide semiconductor by being highly purified in such a manner that impurities that are not main components of the oxide semiconductor are contained as little as possible, whereby characteristics at an interface between the oxide semiconductor and the gate insulating film become more important and thus are needed to be considered separately from those of a bulk of the oxide semiconductor. Thus, the gate insulating film is needed to form a favorable interface with the oxide semiconductor. For example, it is preferable to use an insulating film which is formed by a CVD method which uses high density plasma generated with a power frequency from the VHF band to a microwave band or an insulating film formed by a sputtering method.

When the oxide semiconductor is highly purified and the interface between the oxide semiconductor and the gate insulating film is favorable, even when the thin film transistor has a channel width W of $1 \times 10^4$ μm and a channel length of 3 μm, an off current of less than or equal to $10^{-13}$ A at room temperature and a subthreshold value (S value) of 0.1 V/dec. (the thickness of the gate insulating film: 100 nm) are greatly expected.

As described above, the oxide semiconductor is highly purified so that the amount of impurities that are not main components of the oxide semiconductor is as small as possible, whereby favorable operation of the thin film transistor can be obtained.

The semiconductor element described in this embodiment includes an oxide semiconductor film which is formed with the use of a target material that is treated without being exposed to the air from manufacture to mounting on a sputtering apparatus. The oxide semiconductor film formed using the target material which is treated without being exposed to the air contains few impurities. For example, an oxide semiconductor film whose hydrogen concentration is ideally zero or close to zero according to a technical idea of the present invention can be formed. The hydrogen concentration in the oxide semiconductor layer may be measured by secondary ion mass spectroscopy (SIMS).

In the semiconductor element described in this embodiment, the carrier concentration of the oxide semiconductor film which is formed with the use of a target material that is treated without being exposed to the air is less than or equal to $1 \times 10^{12}$ cm$^{-3}$, preferably less than or equal to the measurement limit of $1 \times 10^{11}$ cm$^{-3}$.

An oxide semiconductor with an energy gap of greater than or equal to 2 eV, preferably greater than or equal to 2.5 eV, more preferably greater than or equal to 3 eV is used. The oxide semiconductor layer is highly purified by thoroughly removing hydrogen contained in the oxide semiconductor layer. That is, a thin film transistor is formed using an oxide semiconductor layer whose carrier concentration is as close to zero as possible for a channel formation region. When an oxide semiconductor layer whose carrier concentration is as close to zero as possible is used for a channel formation region of a thin film transistor, a thin film transistor with an extremely small off-current can be provided.

For example, even in the case where a thin film transistor which includes the highly-purified oxide semiconductor layer has a channel length of 3 μm and a channel width of 10 mm, the thin film transistor operates so that the drain current is less than or equal to $1 \times 10^{-13}$ A in a range of a gate voltage of −5 V to −20 V (off state), when the drain voltage is 1 V or 10 V.

The semiconductor element described in this embodiment includes an oxide semiconductor film with a low impurity concentration for a channel formation region and thus has excellent electric characteristics and high reliability. Specifically, a thin film transistor which has an extremely small off-current and a controlled threshold voltage can be provided. Moreover, a thin film transistor including an oxide semiconductor, which has high operation speed and sufficient reliability and can be manufactured through a relatively simple process, can be provided.

In addition, the amount of shift in threshold voltage can be reduced in a BT stress test (bias-temperature stress test); thus, a highly reliable thin film transistor can be obtained. In this specification, the BT stress test (bias-temperature stress test) refers to a test in which a high gate voltage is applied to a thin film transistor in a high-temperature atmosphere.

This embodiment can be freely combined with any of other embodiments in this specification as appropriate.

Embodiment 4

In this embodiment, an example will be described below in which at least part of a driver circuit and a thin film transistor to be disposed in a pixel portion are formed over one substrate.

The thin film transistor to be arranged in the pixel portion is formed according to Embodiment 3. The thin film transistor described in Embodiment 3 is an n-channel TFT. Thus, part of a driver circuit that can be formed using n-channel TFTs among driver circuits is formed over the same substrate as the thin film transistor of the pixel portion.

Figure 6A:
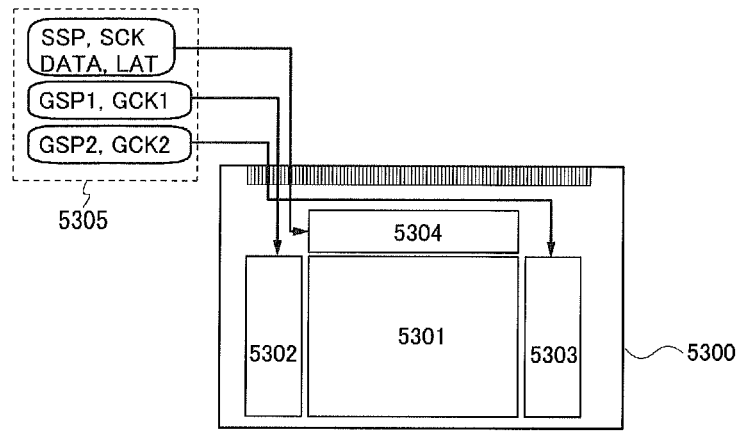
FIGS. 6A and 6B are each a block diagram of a display device according to an embodiment.

FIG. 6A illustrates an example of a block diagram of an active matrix display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines extended from the signal line driver circuit 5304 are arranged and a plurality of scan lines extended from the first scan line driver circuit 5302 and the second scan line driver circuit 5303 are arranged. Note that pixels which include display elements are provided in a matrix in respective regions where the scan lines and the signal lines intersect with each other. Further, the substrate 5300 in the display device is connected to a timing control circuit 5305 (also referred to as a controller or a controller IC) through a connection portion such as a flexible printed circuit (FPC).

In FIG. 6A, the first scan line driver circuit 5302, the second scan line driver circuit 5303, and the signal line driver circuit 5304 are formed over the same substrate 5300 as the pixel portion 5301. Accordingly, the number of components of a driver circuit and the like which are provided outside is reduced, so that reduction in cost can be achieved. If the driver circuit is provided outside the substrate 5300, wirings would need to be extended and the number of connections of wirings would be increased, but by providing the driver circuit over the substrate 5300, the number of connections of the wirings can be reduced. Accordingly, improvement in reliability and yield can be achieved.

Note that for example, the timing control circuit 5305 supplies a first scan line driver circuit start signal (GSP1) and a scan line driver circuit clock signal (GCK1) to the first scan line driver circuit 5302. The timing control circuit 5305 supplies, for example, a second scan line driver circuit start signal (GSP2) (also referred to as a start pulse) and a scan line driver circuit clock signal (GCK2) to the second scan line driver circuit 5303. The timing control circuit 5305 supplies a signal line driver circuit start signal (SSP), a signal line driver circuit clock signal (SCK), video signal data (DATA) (also simply referred to as a video signal) and a latch signal (LAT) to the signal line driver circuit 5304. Note that each clock signal may be a plurality of clock signals whose periods are shifted or may be supplied together with an inverted clock signal (CKB). Note that one of the first scan line driver circuit 5302 and the second scan line driver circuit 5303 can be omitted.

Figure 6B:
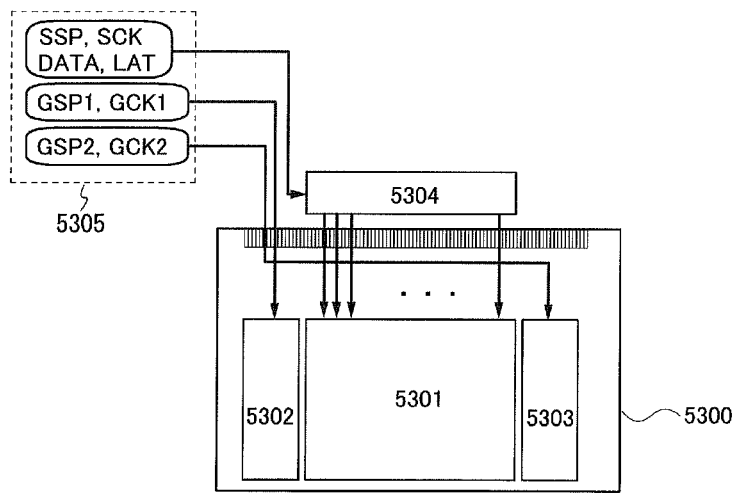

In FIG. 6B, a circuit with a low drive frequency (e.g., the first scan line driver circuit 5302 and the second scan line driver circuit 5303) is formed over the same substrate 5300 as the pixel portion 5301, and the signal line driver circuit 5304 is formed over another substrate which is different from the substrate provided with the pixel portion 5301. With this structure, the signal line driver circuit 5304 can be constituted by using transistors with higher field effect mobility than that of a thin film transistor formed over the substrate 5300. Accordingly, an increase in the size of the display device, a reduction in the number of steps, a reduction in cost, an improvement in yield, and the like can be achieved.

Figure 7A:
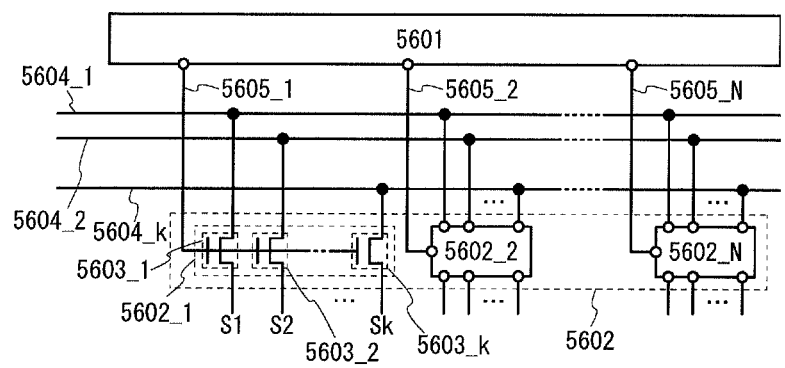
FIG. 7A is a circuit diagram illustrating a structure of a signal line driver circuit and FIG. 7B is a timing chart thereof according to an embodiment.
Figure 7B:
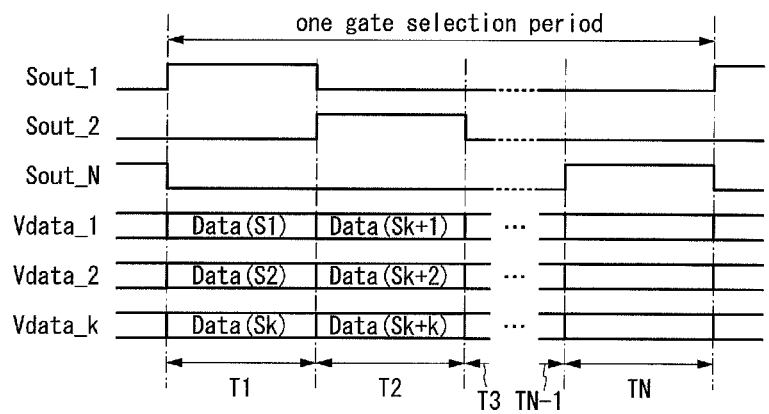

The thin film transistor in Embodiment 4 is an n-channel TFT. In FIGS. 7A and 7B, an example of a structure and operation of a signal line driver circuit formed using n-channel TFTs is described.

The signal line driver circuit includes a shift register 5601 and a switching circuit 5602. The switching circuit 5602 includes a plurality of switching circuits 5602_1 to 5602_N(N is a natural number). The switching circuits 5602_1 to 5602_N each include a plurality of thin film transistors 5603_1 to 5603_$k$ ($k$ is a natural number). The case in which the thin film transistors 5603_1 to 5603_$k$ are n-channel TFTs will be described.

A connection relation of the signal line driver circuit is described by using the switching circuit 5602_1 as an example. First terminals of the thin film transistors 5603_1 to 5603_$k$ are connected to wirings 5604_1 to 5604_$k$, respectively. Second terminals of the thin film transistors 5603_1 to 5603_$k$ are connected to signal lines S1 to Sk, respectively. Gates of the thin film transistors 5603_1 to 5603_$k$ are connected to a wiring 5605_1.

The shift register 5601 has a function of outputting an H level signal (also referred to as an H signal or a high power supply potential level) to the wirings 5605_1 to 5605_N in order and selecting the switching circuits 5602_1 to 5602_N in order.

The switching circuit 5602_1 has a function of controlling conduction states between the wirings 5604_1 to 5604_$k$ and the signal lines S1 to Sk (conduction between the first terminal and the second terminal), that is, a function of controlling whether the potentials of the wirings 5604_1 to 5604_$k$ are supplied to the signal lines S1 to Sk. In this manner, the switching circuit 5602_1 functions as a selector. Further, the thin film transistors 5603_1 to 5603_$k$ have a function of controlling conduction states between the wirings 5604_1 to 5604_$k$ and the signal lines S1 to Sk, namely a function of controlling whether the potentials of the wirings 5604_1 to 5604_$k$ are supplied to the signal lines S1 to Sk. In this manner, each of the thin film transistors 5603_1 to 5603_$k$ functions as a switch.

Note that video signal data (DATA) is input to each of the wirings 5604_1 to 5604_$k$. The video signal data (DATA) is an analog signal corresponding to image data or an image signal in many cases.

Next, operation of the signal line driver circuit illustrated in FIG. 7A is described with reference to a timing chart in FIG. 7B. FIG. 7B illustrates examples of signals Sout_1 to Sout_N and signals Vdata_1 to Vdata_$k$. The signals Sout_1 to Sout_N are examples of output signals of the shift register 5601, and the signals Vdata_1 to Vdata_$k$ are examples of signals which are input to the wirings 5604_1 to 5604_$k$. Note that one operation period of the signal line driver circuit corresponds to one gate selection period in a display device. For example, one gate selection period is divided into periods T1 to TN. The periods T1 to TN are periods for writing video signal data (DATA) to the pixels which belong to a selected row.

In the periods T1 to TN, the shift register 5601 sequentially outputs H level signals to the wirings 5605_1 to 5605_N. For example, in the period T1, the shift register 5601 outputs a high level signal to the wiring 5605_1. Then, the thin film transistors 5603_1 to 5603_$k$ are turned on, so that the wirings 5604_1 to 5604_$k$ and the signal lines S1 to Sk have electrical continuity. In this case, Data (S1) to Data (Sk) are input to the wirings 5604_1 to 5604_$k$, respectively. The Data (S1) to Data (Sk) are input to pixels in a selected row in first to k-th columns through the thin film transistors 5603_1 to 5603_$k$, respectively. Thus, in the periods T1 to TN, video signal data (DATA) is sequentially written to the pixels in the selected row by k columns.

By writing video signal data (DATA) to pixels by a plurality of columns as described above, the number of video signal data (DATA) or the number of wirings can be reduced. Thus, the number of connections to an external circuit can be reduced. In addition, by writing video signals to pixels by a plurality of columns, writing time can be extended and insufficient writing of video signals can be prevented.

Note that a circuit including the thin film transistor described in Embodiment 3 can be used for the shift register 5601 and the switching circuit 5602. In this case, the shift register 5601 can be constituted by only n-channel transistors or only p-channel transistors.

Further, a structure of a scan line driver circuit is described. The scan line driver circuit includes a shift register. Additionally, the scan line driver circuit may include a level shifter, a buffer, or the like in some cases. In the scan line driver circuit, when the clock signal (CK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply a large current is used.

An embodiment of a shift register which is used for part of the scan line driver circuit and/or the signal line driver circuit is described with reference to FIGS. 8A to 8C and FIGS. 9A and 9B.

Figure 8A:
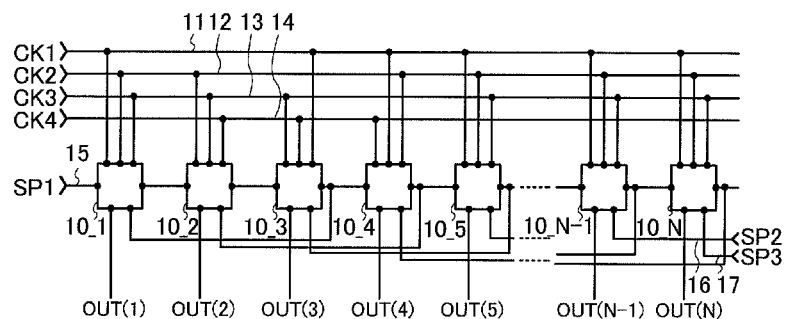
FIGS. 8A to 8C are each a circuit diagram illustrating a structure of a shift register.

A shift register of a scan line driver circuit and/or a signal line driver circuit is described with reference to FIGS. 8A to 8C and FIGS. 9A and 9B. The shift register includes first to N-th pulse output circuits 10_1 to 10_N(N≥3 and N is a natural number) (see FIG. 8A). A first clock signal CK1, a second clock signal CK2, a third clock signal CK3, and a fourth clock signal CK4 are supplied to the first to N-th pulse output circuits 10_1 to 10_N of the shift register illustrated in FIG. 8A from a first wiring 11, a second wiring 12, a third wiring 13, and a fourth wiring 14, respectively. A start pulse SP1 (a first start pulse) from a fifth wiring 15 is input to the first pulse output circuit 10_1. To the n-th pulse output circuit 10_$n$ of the second or subsequent stage (2≤n≤N, and n is a natural number), a signal from the pulse output circuit of the preceding stage (such a signal is referred to as a preceding-stage signal OUT(n−1)) (n≥2, and n is a natural number) is input. A signal from the third pulse output circuit 103 which is two stages after the first pulse output circuit 10_1 is input to the first pulse output circuit 10_1. In a similar manner, a signal from the (n+2)-th pulse output circuit 10_(n+2) (also referred to as a subsequent stage signal OUT (n+2)) which is two stages after the n-th pulse output circuit 10_$n$ is input to the n-th pulse output circuit 10_$n$ of the second or subsequent stage. Therefore, from the pulse output circuit in each stage, a first output signal ((OUT(1) (SR) to OUT(N)(SR)) to be input to a pulse output circuit in the next stage and/or in two stages before the pulse output circuit and a second output signal ((OUT(1) to OUT(N)) for electrical connection to a different wiring or the like are output. Note that since the subsequent-stage signal OUT(n+2) is not input to the last two stages of the shift register as illustrated in FIG. 8A, a second start pulse SP2 and a third start pulse SP3 may be additionally input from a sixth wiring 16 and a seventh wiring 17, respectively, to the pulse output circuits of the last two stages, for example. Alternatively, a signal which is additionally generated in the shift register may be used. For example, a (n+1)-th pulse output circuit 10_(n+1) and a (n+2)-th pulse output circuit 10_(n+2) which do not contribute to output of pulses to a pixel portion (such circuits are also referred to as dummy stages) may be provided, and signals corresponding to a second start pulse (SP2) and a third start pulse (SP3) may be generated from the dummy stages.

Note that a clock signal (CK) is a signal which oscillates between an H level and an L level (also referred to as an L signal or a low power supply potential level) at a constant cycle. The first to fourth clock signals (CK1) to (CK4) are delayed by ¼ period sequentially. In this embodiment, by using the first to fourth clock signals (CK1) to (CK4), control or the like of driving of a pulse output circuit is performed. Note that the clock signal is also called GCK or SCK in accordance with an driver circuit to which the clock signal is input; however, description is made using CK as the clock signal.

A first input terminal 21, a second input terminal 22, and a third input terminal 23 are electrically connected to any of the first to fourth wirings 11 to 14. For example, in FIG. 8A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

Figure 8B:
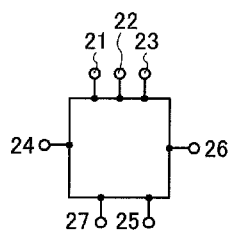

Each of the first to N-th pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 8B). In the first pulse output circuit 10_1, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent stage signal OUT (3) is input to the fifth input terminal 25; the first output signal OUT (1) (SR) is output from the first output terminal 26; and the second output signal OUT (1) is output from the second output terminal 27.

Next, an example of a specific circuit structure of the pulse output circuit is described with reference to FIG. 8C.

Figure 8C:
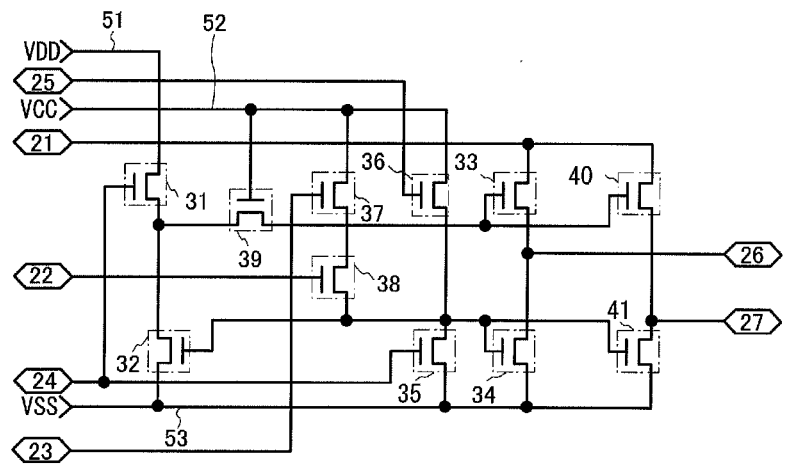

The first pulse output circuit 10_1 includes first to eleventh transistors 31 to 41 (see FIG. 8C). Signals and power supply potentials are supplied to the first transistor 31 to the eleventh transistor 41 from a power supply line 51 to which a first high power supply potential VDD is supplied, a power supply line 52 to which a second high power supply potential VCC is supplied, and a power supply line 53 to which a low power supply potential VSS is supplied, in addition to the first input terminal 21 to the fifth input terminal 25, the first output terminal 26, and the second output terminal 27, which are described above. The relation of the power supply potentials of the power supply lines in FIG. 8C is as follows: the first high power supply potential VDD is greater than or equal to the second high power supply potential VCC, and the second high power supply potential VCC is greater than the third low power supply potential VSS. Each of the first to fourth clock signals (CK1) to (CK4) is a signal which oscillates between an H level and an L signal at a certain cycle. The potential is VDD when the clock signal is at an H level, and the potential is VSS when the clock signal is at an L level. By making the potential VDD of the power supply line 51 higher than the potential VCC of the power supply line 52, a potential applied to a gate electrode of a transistor can be lowered, shift in threshold voltage of the transistor can be reduced, and deterioration of the transistor can be suppressed without an adverse effect on the operation of the transistor.

In FIG. 8C, a first terminal of the first transistor 31 is electrically connected to the power supply line 51, a second terminal of the first transistor 31 is electrically connected to a first terminal of the ninth transistor 39, and gate electrodes (a lower gate electrode and an upper gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a lower gate electrode and an upper gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a lower gate electrode and an upper gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 are electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and gate electrodes (a lower gate electrode and an upper gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and the gate electrode of the eleventh transistor 41 is electrically connected to the gate electrode of the second transistor 32 and the gate electrode of the fourth transistor 34.

In FIG. 8C, a connection portion of the gate electrode of the third transistor 33, the gate electrode of the tenth transistor 40, and the second terminal of the ninth transistor 39 is referred to as a node A. A connection point of the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is referred to as a node B (see FIG. 9A).

Note that a thin film transistor is an element having at least three terminals of a gate, a drain, and a source. The thin film transistor has a channel region between a drain region and a source region, and current can flow through the drain region, the channel region, and the source region. Here, since the source and the drain of the thin film transistor may interchange depending on the structure, the operating condition, and the like of the thin film transistor, it is difficult to define which is the source or the drain. Therefore, a region functioning as the source or the drain is not called the source or the drain in some cases. In such a case, for example, one of the source and the drain may be referred to as a first terminal and the other thereof may be referred to as a second terminal.

Figure 9A:
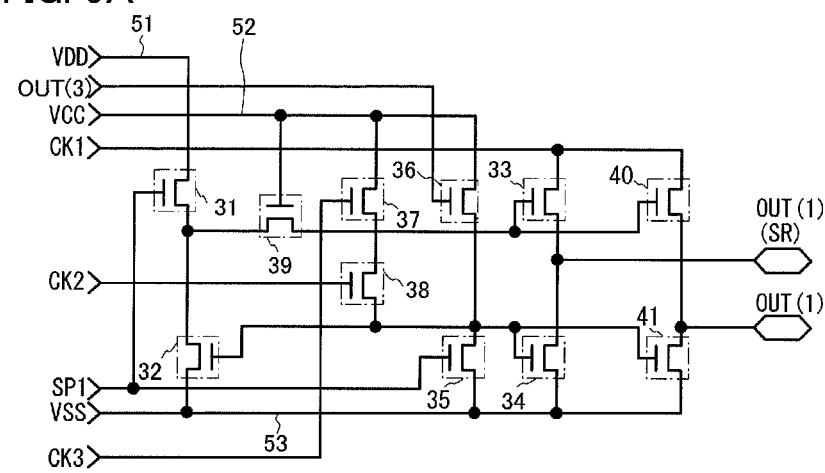
FIGS. 9A and 9B are a circuit diagram and a timing chart illustrating operation of a shift register.
Figure 9B:
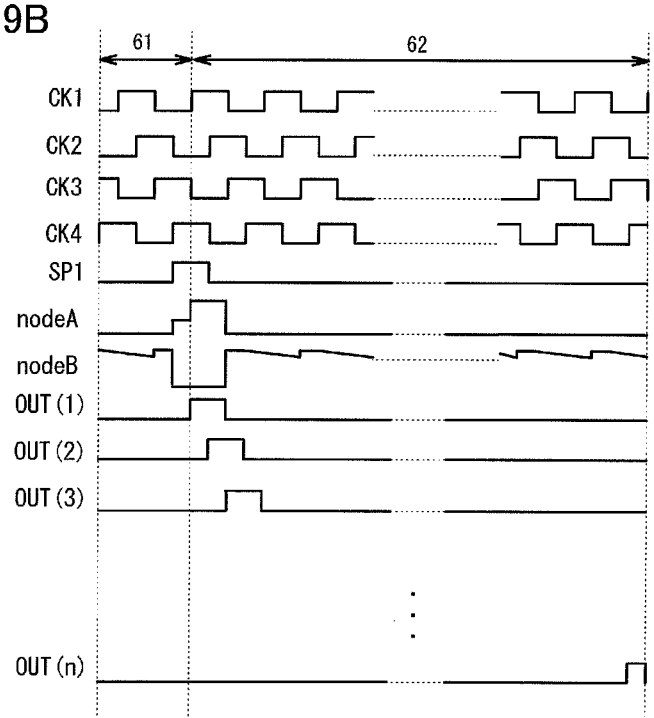

Here, FIG. 9B illustrates a timing chart of a shift register including a plurality of the pulse output circuits illustrated in FIG. 9A. Note that when the shift register is included in a scan line driver circuit, a period 61 in FIG. 9B corresponds to a vertical retrace period and a period 62 corresponds to a gate selection period.

Note that by providing the ninth transistor 39 in which the second power supply potential VCC is applied to the gate as illustrated in FIG. 9A, the following advantages before and after the bootstrap operation are provided.

In the case where the ninth transistor 39 having the gate electrode to which the second power supply potential VCC is applied is not provided, when the potential at the node A is increased due to the bootstrap operation, the potential of a source which is the second terminal of the first transistor 31 increases to a value higher than the first power supply potential VDD. Then, the first terminal of the first transistor 31, namely the power supply line 51 side, becomes to serve as the source thereof. Therefore, in the first transistor 31, a large bias voltage is applied and thus significant stress is applied between the gate and the source and between the gate and the drain, which can cause deterioration in the transistor. By providing the ninth transistor 39 whose gate electrode is supplied the second power supply potential VCC, the potential of the node A is raised by the bootstrap operation, but at the same time, an increase in the potential of the second terminal of the first transistor 31 can be prevented. In other words, by providing the ninth transistor 39, a negative bias voltage applied between the gate and the source of the first transistor 31 can be reduced. Accordingly, with a circuit structure in this embodiment, a negative bias voltage applied between the gate and the source of the first transistor 31 can be reduced, so that deterioration in the first transistor 31, which is due to stress, can be restrained.

Note that the ninth transistor 39 is provided so as to be connected between the second terminal of the first transistor 31 and the gate of the third transistor 33 through the first terminal and the second terminal thereof. In the case of employing a shift register including a plurality of pulse output circuits of this embodiment, the ninth transistor 39 may be omitted in a signal line driver circuit in which the number of stages is larger than that of a scan line driver circuit, in order to reduce the number of transistors.

Note that when oxide semiconductors are used for semiconductor layers for the first to eleventh transistors 31 to 41, the off-current of the thin film transistors can be reduced, the on-current and the field effect mobility can be increased, and the degree of deterioration can be reduced, whereby malfunction of a circuit can decrease. In a transistor formed using an oxide semiconductor, the degree of deterioration of the transistor due to the application of a high potential to the gate electrode is low compared to a transistor formed using amorphous silicon. Therefore, even when the first power supply potential VDD is supplied to a power supply line to which the second power supply potential VCC is supplied, a similar operation can be performed, and the number of power supply lines which are provided in a circuit can be reduced, so that the circuit can be miniaturized.

Note that a similar function is obtained even when the connection relation is changed so that a clock signal that is supplied to the gate electrode of the seventh transistor 37 from the third input terminal 23 and a clock signal that is supplied to the gate electrode of the eighth transistor 38 from the second input terminal 22 are supplied from the second input terminal 22 and the third input terminal 23, respectively. Note that in the shift register shown in FIG. 9A, after the seventh transistor 37 and the eighth transistor 38 are both turned on, the seventh transistor 37 is turned off and the eighth transistor 38 is kept on, and then the seventh transistor 37 is kept off and the eighth transistor 38 is turned off. Therefore, a decrease in the potential of the node B, which is caused by a decrease in the potentials of the second input terminal 22 and the third input terminal 23, occurs twice because of a decrease in the potential of the gate electrode of the seventh transistor 37 and a decrease in the potential of the gate electrode of the eighth transistor 38. However, in the shift register illustrated in FIG. 9A, when the seventh transistor 37 and the eighth transistor 38 are both turned on, the seventh transistor 37 is kept on and the eighth transistor 38 is turned off, and then the seventh transistor 37 is turned off and the eighth transistor 38 is kept off, the decrease in the potential of the node B, which is caused by the decrease in the potentials of the second input terminal 22 and the third input terminal 23, can be reduced to once due to the decrease in the potential of the gate electrode of the eighth transistor 38. Consequently, the connection relation in which the clock signal CK3 is supplied from the third input terminal 23 to the gate electrode of the seventh transistor 37 and the clock signal CK2 is supplied from the second input terminal 22 to the gate electrode of the eighth transistor 38 is preferable because fluctuation in potential of the node B is reduced and noise can be reduced.

In this way, in a period during which the potentials of the first output terminal 26 and the second output terminal 27 are held at an L level, an H level signal is regularly supplied to the node B; therefore, malfunction of a pulse output circuit can be suppressed.

Embodiment 5

The thin film transistors described in Embodiment 3 are manufactured, and the thin film transistors are used for a pixel portion and further for a driver circuit, so that a semiconductor device having a display function (also referred to as a display device) can be manufactured. Moreover, the thin film transistors described in Embodiment 3 can be used for part of a driver circuit or an entire driver circuit formed over the same substrate as a pixel portion, so that a system-on-panel can be formed.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

The display device includes a panel in which the display element is sealed, and a module in which an IC or the like including a controller is mounted on the panel. Furthermore, an element substrate, which corresponds to an embodiment before the display element is completed in a manufacturing process of the display device, is provided with a means for supplying current to the display element in each of a plurality of pixels. Specifically, the element substrate may be in a state in which only a pixel electrode of the display element is provided, a state after formation of a conductive film to be a pixel electrode and before etching of the conductive film to form the pixel electrode, or any other states.

Note that a display device in this specification means an image display device, a display device, or a light source (including a lighting device). Further, the "display device" includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

In this embodiment, the appearance and the cross section of a liquid crystal display panel, which is an embodiment of a semiconductor device, will be described with reference to FIGS. 10A1 to 10B. Each of FIGS. 10A1 and 10A2 is a top view of a panel in which highly reliable thin film transistors 4010 and 4011 each including the In—Ga—Zn—O-based film described in Embodiment 3 as an oxide semiconductor layer and a liquid crystal element 4013 which are formed over a first substrate 4001 are sealed between the first substrate 4001 and a second substrate 4006 with a sealant 4005. FIG. 10B is a cross-sectional view taken along line M-N of FIGS. 10A1 and 10A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on a connection method of the driver circuit which is separately formed, and a COG method, a wire bonding method, a TAB method, or the like can be used. FIG. 10A1 illustrates an example of mounting the signal line driver circuit 4003 by a COG method, and FIG. 10A2 illustrates an example of mounting the signal line driver circuit 4003 by a TAB method.

Further, the pixel portion 4002 and the scan line driver circuit 4004, which are formed over the first substrate 4001, each include a plurality of thin film transistors. The thin film transistor 4010 included in the pixel portion 4002 and the thin film transistor 4011 included in the scan line driver circuit 4004 are illustrated in FIG. 10B. Over the thin film transistors 4010 and 4011, insulating layers 4020 and 4021 are provided.

The highly reliable thin film transistors each including the In—Ga—Zn—O-based film as the oxide semiconductor layer described in Embodiment 3 can be used as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is provided adjacent to the second substrate 4006. A portion where the pixel electrode layer 4030, the counter electrode layer 4031, and the liquid crystal layer 4008 overlap with each other corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 therebetween. Although not illustrated, a color filter may be provided on either the first substrate 4001 side or the second substrate 4006 side.

Note that the first substrate 4001 and the second substrate 4006 can be formed of glass, metal (typically, stainless steel), ceramic, or plastic. As plastics, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may be used. In addition, the counter electrode layer 4031 is electrically connected to a common potential line formed over the same substrate as the thin film transistor 4010. With the use of a common connection portion, the counter electrode layer 4031 and the common potential line can be electrically connected to each other by conductive particles arranged between a pair of substrates. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase is generated within an only narrow range of temperature, a liquid crystal composition containing a chiral agent at greater than or equal to 5 wt % so as to improve the temperature range is used for the liquid crystal layer 4008. The liquid crystal composition including liquid crystal exhibiting a blue phase and a chiral agent has a short response time of greater than or equal to 10 μsec and less than or equal to 100 μsec and is optically isotropic; therefore, alignment treatment is not necessary and viewing angle dependence is small.

Note that although this embodiment shows an example of a transmissive liquid crystal display device, the present invention can be applied to a reflective liquid crystal display device or a transflective liquid crystal display device.

While an example of a liquid crystal display device in which a polarizing plate is provided on the outer side of a substrate (on the viewer side) and a coloring layer and an electrode layer used for a display element are provided on the inner side of the substrate in that order is described in this embodiment, the polarizing plate may be provided on the inner side of the substrate. The layered structure of the polarizing plate and the coloring layer is not limited to this embodiment and may be set as appropriate depending on materials of the polarizing plate and the coloring layer or conditions of manufacturing process. Further, a light-blocking film serving as a black matrix may be provided.

In this embodiment, in order to reduce the unevenness of the surface of the thin film transistors and to improve the reliability of the thin film transistors, the thin film transistors which are obtained in Embodiment 3 are covered with protective films or insulating layers (the insulating layers 4020 and 4021) serving as planarizing insulating films. Note that the protective film is provided to prevent entry of contaminant impurities such as an organic substance, metal, or water vapor contained in the air and is preferably a dense film. The protective film may be formed with a single layer or a stack layer using one or more of a silicon oxide film, a silicon nitride film, a silicon oxynitride film, a silicon nitride oxide film, an aluminum oxide film, an aluminum nitride film, aluminum oxynitride film, and an aluminum nitride oxide film by a sputtering method. Although an example in which the protective film is formed by a sputtering method is described in this embodiment, the present invention is not limited to this method and a variety of methods may be employed.

In this embodiment, the insulating layer 4020 having a layered structure is formed as a protective film. Here, a silicon oxide film is formed by a sputtering method, as a first layer of the insulating layer 4020. The use of a silicon oxide film as a protective film has an effect of preventing hillock of an aluminum film which is used as the source and drain electrode layers.

As a second layer of the protective film, an insulating layer is formed. Here, a silicon nitride film is formed by a sputtering method, as a second layer of the insulating layer 4020. The use of the silicon nitride film as the protective film can prevent mobile ions of sodium or the like from entering a semiconductor region so that variation in electric characteristics of the TFT can be suppressed.

After the protective film is formed, annealing (300° C. to 400° C. inclusive) of the oxide semiconductor layer may be performed.

The insulating layer 4021 is formed as the planarizing insulating film. The insulating layer 4021 can be formed using a heat-resistant organic material such as acrylic, polyimide, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

A formation method of the insulating layer 4021 is not particularly limited, and the following method or tool can be employed depending on the material: a sputtering method, an SOG method, a spin coating method, a dipping method, a spray coating method, a droplet discharge method (e.g., an ink-jet method, screen printing, offset printing, or the like), a doctor knife, a roll coater, a curtain coater, a knife coater, or the like. In the case of forming the insulating layer 4021 with the use of a liquid material, annealing (300° C. to 400° C. inclusive) of the oxide semiconductor layer may be performed at the same time as a baking step. When the baking of the insulating layer 4021 and the annealing of the oxide semiconductor layer are performed at the same time, a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

In addition, conductive compositions including a conductive high molecule (also referred to as a conductive polymer) can be used for the pixel electrode layer 4030 and the counter electrode layer 4031. A pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ωcm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

In this embodiment, a connection terminal electrode 4015 is formed from the same conductive film as the pixel electrode layer 4030 included in the liquid crystal element 4013, and a terminal electrode 4016 is formed from the same conductive film as the source and drain electrode layers of the thin film transistors 4010 and 4011.

The connection terminal electrode 4015 is electrically connected to a terminal included in the FPC 4018 via an anisotropic conductive film 4019.

FIGS. 10A1, 10A2, and 10B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 11:
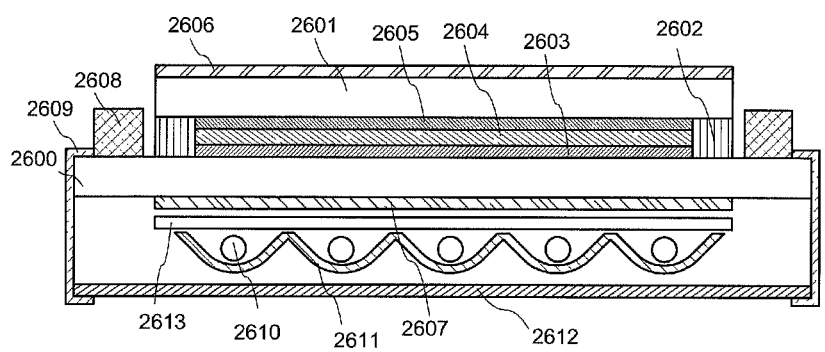
FIG. 11 illustrates a semiconductor device according to an embodiment.

FIG. 11 illustrates an example in which a liquid crystal display module is formed as a semiconductor device by using a TFT substrate 2600 manufactured by applying the TFT described in Embodiment 3.

FIG. 11 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Through the above process, a highly reliable liquid crystal display panel as a semiconductor device can be manufactured.

Note that the structure described in this embodiment can be combined with any of the structures described in other embodiments as appropriate.

Embodiment 6

In this embodiment, an example of an electronic paper is described as a semiconductor device to which the thin film transistor described in Embodiment 3 is applied.

Figure 12:
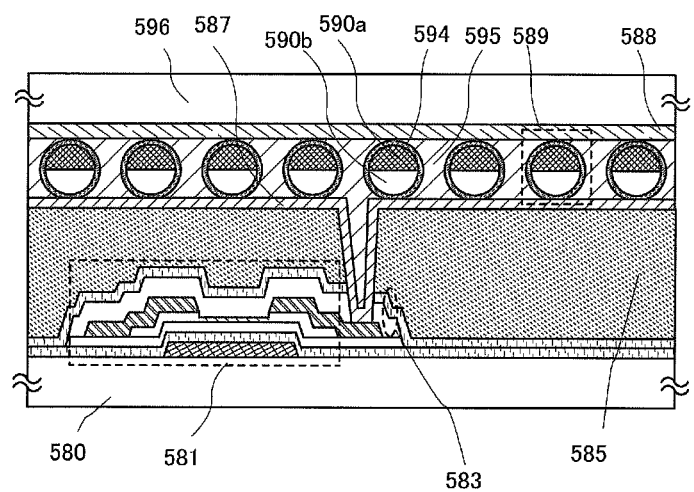
FIG. 12 illustrates a semiconductor device according to an embodiment.

FIG. 12 illustrates an active matrix electronic paper as an example of a semiconductor device. The thin film transistor described in Embodiment 3 can be used as a thin film transistor 581 used for the semiconductor device.

The electronic paper in FIG. 12 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 sealed between a substrate 580 and a substrate 596 is a thin film transistor with a bottom gate structure, and a source or drain electrode layer thereof is in contact with and electrically connected to a first electrode layer 587 through an opening formed in insulating layers 583 and 585. Between the first electrode layer 587 and a second electrode layer 588, spherical particles 589 each having a black region 590a, a white region 590b, and a cavity 594 around the regions which is filled with liquid are provided. A space around the spherical particles 589 is filled with a filler 595 such as a resin (see FIG. 12). In this embodiment, the first electrode layer 587 corresponds to a pixel electrode, and the second electrode layer 588 corresponds to a common electrode. The second electrode layer 588 is electrically connected to a common potential line provided over the same substrate as the thin film transistor 581. The second electrode layer 588 and the common potential line can be electrically connected to each other through conductive particles provided between the pair of substrates 580 and 596.

Further, instead of the twisting ball, an electrophoretic element can be used. A microcapsule having a diameter of approximately 10 µm to 200 µm inclusive in which transparent liquid, positively charged white microparticles, and negatively charged black microparticles are encapsulated, is used. In the microcapsule provided between the first electrode layer and the second electrode layer, when an electric field is applied by the first electrode layer and the second electrode layer, the white microparticles and the black microparticles move in opposite directions, so that white or black can be displayed. A display element using this principle is an electrophoretic display element, and is called an electronic paper in general. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, a highly reliable electronic paper as a semiconductor device can be manufactured.

Note that the structure described in this embodiment can be combined with any of the structures described in other embodiments as appropriate.

Embodiment 7

In this embodiment, an example of a light-emitting display device will be described as a semiconductor device to which the thin film transistor described in Embodiment 3 is applied. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, so that current flows. Then, recombination of these carriers (the electrons and holes) makes the light-emitting organic compound to form an excited state and to emit light when it returns from the excited state to a ground state. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 13:
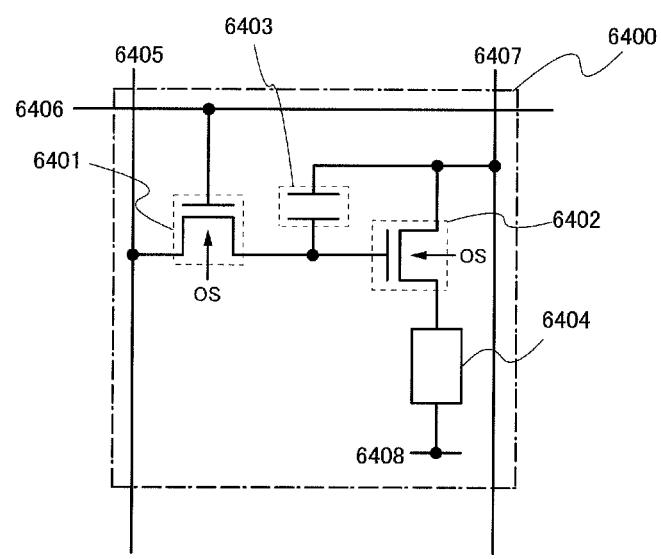
FIG. 13 illustrates a circuit diagram according to an embodiment.

FIG. 13 illustrates an example of a pixel structure as an example of a semiconductor device of the present invention, which can be driven by a digital time grayscale method.

A structure and operation of a pixel to which digital time grayscale driving can be applied are described. Here, an example is described in which one pixel includes two n-channel transistors each of which is described in Embodiment 3 and each of which includes the oxide semiconductor layer (In—Ga—Zn—O-based film) in a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate. The above connection portion may be used as a common connection portion.

The second electrode (common electrode 6408) of the light-emitting element 6404 is set to a low power supply potential. Note that the low power supply potential is a potential satisfying the low power supply potential <a high power supply potential with reference to the high power supply potential that is set for the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is greater than or equal to a forward threshold voltage of the light-emitting element 6404.

Note that gate capacitance of the driver transistor 6402 may be used as a substitute for the capacitor 6403, so that the capacitor 6403 can be omitted. The gate capacitance of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on and turned off. That is, the driver transistor 6402 operates in a linear region. Since the driver transistor 6402 operates in the linear region, a voltage higher than the voltage of the power supply line 6407 is applied to the gate of the driver transistor 6402. Note that a voltage greater than or equal to "voltage of the power supply line+Vth of the driver transistor 6402" is applied to the signal line 6405.

In the case where analog grayscale driving is employed instead of the digital time grayscale driving, the same pixel structure as in FIG. 13 can be employed by changing signal input.

In the case of performing analog grayscale driving, a voltage greater than or equal to "forward voltage of the light-emitting element 6404+Vth of the driver transistor 6402" is applied to the gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

The pixel structure illustrated in FIG. 13 is not limited thereto. For example, a switch, a resistor, a capacitor, a transistor, a logic circuit, or the like may be added to the pixel in FIG. 13.

Next, a structure of a light-emitting element is described with reference to FIGS. 14A to 14C. Here, a cross-sectional structure of a pixel will be described by taking an n-channel driver TFT as an example. Driver TFTs 7011, 7021, and 7001 used for semiconductor devices illustrated in FIGS. 14A to 14C can be manufactured in a manner similar to that of the thin film transistor described in Embodiment 3 and are highly reliable thin film transistors each including an In—Ga—Zn—O-based film as an oxide semiconductor layer.

In order to extract light emitted from the light-emitting element, at least one of an anode and a cathode is required to transmit light. A transistor and a light-emitting element are formed over a substrate. The light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure of the present invention can be applied to a light-emitting element having any of these emission structures.

A light-emitting element having the bottom emission structure is described with reference to FIG. 14A.

FIG. 14A is a cross-sectional view of a pixel in the case where the driver TFT 7011 is an n-channel TFT and light is emitted from a light-emitting element 7012 to a first electrode 7013 side. In FIG. 14A, the first electrode 7013 of the light-emitting element 7012 is formed over a conductive film 7017 which transmits visible light and is electrically connected to a drain electrode layer of the driver TFT 7011, and an EL layer 7014 and a second electrode 7015 are stacked in this order, over the first electrode 7013.

As the conductive film 7017 which transmits visible light, a conductive film which transmits visible light such as a film of indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

Any of a variety of materials can be used for the first electrode 7013 of the light-emitting element. For example, in the case where the first electrode 7013 is used as a cathode, the first electrode 7013 is preferably formed using, for example, a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In FIG. 14A, the first electrode 7013 is formed to have a thickness enough to transmit visible light (preferably, approximately 5 nm to 30 nm). For example, an aluminum film with a thickness of 20 nm is used as the first electrode 7013.

Alternatively, a conductive film which transmits visible light and an aluminum film may be stacked and then selectively etched so as to form the conductive film 7017 which transmits visible light and the first electrode 7013, which is preferable because the etching can be performed using the same mask.

The peripheral portion of the first electrode 7013 is covered with a partition 7019. The partition 7019 is formed using an organic resin film of polyimide, acrylic, polyamide, epoxy, or the like, an inorganic insulating film, or organic polysiloxane. It is particularly preferable that the partition 7019 be formed using a photosensitive resin material to have an opening over the first electrode 7013 so that a sidewall of the opening is formed as an inclined surface with continuous curvature. In the case where a photosensitive resin material is used for the partition 7019, a step of forming a resist mask can be omitted.

The EL layer 7014 which is formed over the first electrode 7013 and the partition 7019 may include at least a light-emitting layer and be formed using a single layer or a plurality of layers stacked. When the EL layer 7014 is formed using a plurality of layers, an electron-injection layer, an electron-transport layer, a light-emitting layer, a hole-transport layer, and a hole-injection layer are stacked in this order over the first electrode 7013 which serves as a cathode. It is not necessary to form all of these layers.

The stacking order is not limited to the above stacking order, and a hole-injection layer, a hole-transport layer, a light-emitting layer, an electron-transport layer, and an electron-injection layer may be stacked in this order over the first electrode 7013 which serves as an anode. However, when power consumption is compared, it is preferable that the first electrode 7013 serve as a cathode and an electron-injection layer, an electron-transport layer, a light-emitting layer, a hole-transport layer, and a hole-injection layer be stacked in this order over the first electrode 7013 because voltage rise in the driver circuit portion can be suppressed and power consumption can be decreased.

As the second electrode 7015 formed over the EL layer 7014, various materials can be used. For example, in the case where the second electrode 7015 is used as an anode, a material having a high work function (e.g., greater than or equal to 4.0 eV), for example, ZrN, Ti, W, Ni, Pt, Cr, or the like; or a transparent conductive material such as ITO, IZO, or ZnO is preferable. Further, a light-blocking film 7016, for example, a metal which blocks light, a metal which reflects light, or the like is provided over the second electrode 7015. In this embodiment, an ITO film is used as the second electrode 7015 and a Ti film is used as the light-blocking film 7016.

The light-emitting element 7012 corresponds to a region where the first electrode 7013 and the second electrode 7015 sandwich the EL layer 7014 including a light-emitting layer. In the case of the element structure illustrated in FIG. 14A, light is emitted from the light-emitting element 7012 to the first electrode 7013 side as indicated by arrows.

Note that in FIG. 14A, light emitted from the light-emitting element 7012 passes through a color filter layer 7033, an insulating layer 7032b, an oxide insulating layer 7032a, a gate insulating layer 7031, and a substrate 7030 to be emitted.

The color filter layer 7033 is formed by a droplet discharge method such as an ink-jet method, a printing method, an etching method with the use of a photolithography technique, or the like.

The color filter layer 7033 is covered with an overcoat layer 7034, and also covered with a protective insulating layer 7035. Although the overcoat layer 7034 is illustrated to have a small thickness in FIG. 14A, the overcoat layer 7034 has a function of reducing unevenness caused by the color filter layer 7033 with the use of a resin material such as an acrylic resin.

A contact hole which is formed in the protective insulating layer 7035 and the insulating layer 7032 and reaches the drain electrode layer is provided in a portion which overlaps with the partition 7019.

Next, a light-emitting element having the dual emission structure is described with reference to FIG. 14B.

In FIG. 14B, a first electrode 7023 of a light-emitting element 7022 is formed over a conductive film 7027 which transmits visible light and is electrically connected to a drain electrode layer of the driver TFT 7021 provided over a substrate 7040, and an EL layer 7024 and a second electrode 7025 are stacked in this order over the first electrode 7023.

As the conductive film 7027 which transmits visible light, a conductive film which transmits visible light such as a film of indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

Any of a variety of materials can be used for the first electrode 7023. For example, in the case of using the first electrode 7023 as a cathode, a material having a low work function is preferably used; specifically, for example, an alkali metal such as Li or Cs, an alkaline earth metal such as Mg, Ca, or Sr, an alloy containing any of these (such as Mg:Ag or Al:Li), a rare earth metal such as Yb or Er, or the like is preferable. In this embodiment, the first electrode 7023 is used as a cathode and has a thickness with which light can be transmitted (preferably, approximately 5 nm to 30 nm). For example, an aluminum film with a thickness of 20 nm can be used as the first electrode 7023.

Note that a conductive film which transmits visible light and an aluminum film may be stacked and then selectively etched, whereby the conductive film 7027 which transmits visible light and the first electrode 7023 may be formed. In this case, etching can be performed with the use of the same mask, which is preferable.

The periphery of the first electrode 7023 is covered with a partition 7029. The partition 7029 is formed using an organic resin film of polyimide, acrylic, polyamide, epoxy, or the like, an inorganic insulating film, or organic polysiloxane. It is particularly preferable that the partition 7029 be formed using a photosensitive material to have an opening over the first electrode 7023 so that a sidewall of the opening is formed as an inclined surface with continuous curvature. In the case where a photosensitive resin material is used for the partition 7029, a step of forming a resist mask can be omitted.

The EL layer 7024 which is formed over the first electrode 7023 and the partition 7029 may include at least a light-emitting layer and be formed using a single layer or a plurality of layers stacked. When the EL layer 7024 is formed using a plurality of layers, an electron-injection layer, an electron-transport layer, a light-emitting layer, a hole-transport layer, and a hole-injection layer are stacked in this order over the first electrode 7023 serving as a cathode. It is not necessary to form all of these layers.

The stacking order is not limited to the above order. The first electrode 7023 may function as an anode, and a hole-injection layer, hole-transport layer, a light-emitting layer, an electron-transport layer, and an electron-injection layer may be stacked in this order over the anode. Note that when power consumption is compared, the first electrode 7023 is used as a cathode, and stacking an electron-injection layer, an electron-transport layer, a light-emitting layer, a hole-transport layer, and a hole-injection layer in this order over the cathode leads to low power consumption and thus is more preferable.

As the second electrode 7025 formed over the EL layer 7024, various materials can be used. For example, in the case where the second electrode 7025 is used as an anode, a material having a high work function, for example, a transparent conductive material such as ITO, IZO, or ZnO is preferable. In this embodiment, the second electrode 7025 is used as an anode, and an ITO film containing silicon oxide is formed.

The light-emitting element 7022 corresponds to a region where the EL layer 7024 including a light-emitting layer is sandwiched between the first electrode 7023 and the second electrode 7025. In the case of the element structure illustrated in FIG. 14B, light is emitted from the light-emitting element 7022 to both the second electrode 7025 side and the first electrode 7023 side as indicated by arrows.

Note that in FIG. 14B, light emitted from the light-emitting element 7022 to the first electrode 7023 side passes through a color filter layer 7043, an insulating layer 7042b, an oxide insulating layer 7042a, a gate insulating layer 7041, and the substrate 7040 to be emitted.

The color filter layer 7043 is formed by a droplet discharge method such as an ink-jet method, a printing method, an etching method with the use of a photolithography technique, or the like.

The color filter layer 7043 is covered with an overcoat layer 7044, and also covered with a protective insulating layer 7045.

A contact hole which is formed in the protective insulating layer 7045 and the insulating layer 7042 and reaches the drain electrode layer is provided in a portion which overlaps with the partition 7029.

Note that in the case where the light-emitting element having a dual emission structure is used and full color display is performed on both display surfaces, light from the second electrode 7025 side does not pass through the color filter layer 7043; therefore, a sealing substrate provided with a color filter layer is preferably provided over the second electrode 7025.

A light-emitting element having a top emission structure will be described with reference to FIG. 14C.

FIG. 14C is a cross-sectional view of a pixel in the case where the driver TFT 7001 is an n-channel transistor and light is emitted from a light-emitting element 7002 to a second electrode layer 7005 side. In FIG. 14C, a first electrode 7003 of the light-emitting element 7002 is formed to be electrically connected to a drain electrode layer of the driver TFT 7001, and an EL layer 7004 and the second electrode 7005 are stacked in this order over the first electrode 7003.

Any of a variety of materials can be used for the first electrode 7003. For example, when the first electrode 7003 is used as a cathode, it is preferable to use a material having a low work function, such as an alkali metal such as Li or Cs, an alkaline-earth metal such as Mg, Ca, or Sr, an alloy containing any of these (Mg:Ag, Al:Li, or the like), or a rare-earth metal such as Yb or Er.

The periphery of the first electrode 7003 is covered with a partition 7009. The partition 7009 is formed using an organic resin film of polyimide, acrylic, polyamide, epoxy, or the like, an inorganic insulating film, or organic polysiloxane. It is particularly preferable that the partition 7009 be formed using a photosensitive resin material to have an opening over the first electrode 7003 so that a sidewall of the opening is formed as an inclined surface with continuous curvature. In the case where a photosensitive resin material is used for the partition 7009, a step of forming a resist mask can be omitted.

The EL layer 7004 which is formed over the first electrode 7003 and the partition 7009 may include at least a light-emitting layer and be formed using a single layer or a plurality of layers stacked. When the EL layer 7004 is formed using a plurality of layers, the EL layer 7004 is formed by stacking an electron-injection layer, an electron-transport layer, a light-emitting layer, a hole-transport layer, and a hole-injection layer in this order over the first electrode 7003 serving as a cathode. It is not necessary to form all of these layers.

The stacking order is not limited to the above order, and a hole-injection layer, a hole-transport layer, a light-emitting layer, an electron-transport layer, and an electron-injection layer may be stacked in this order over the first electrode 7003 used as an anode.

In FIG. 14C, a hole-injection layer, a hole-transport layer, a light-emitting layer, an electron-transport layer, and an electron-injection layer are stacked in this order over a laminate film in which a Ti film, an aluminum film, and a Ti film are stacked in this order. Further, a stacked layer of a Mg:Ag alloy thin film and an ITO film is formed thereover.

Note that when the driver TFT 7001 is an n-channel TFT, it is more preferable that an electron-injection layer, an electron-transport layer, a light-emitting layer, a hole-transport layer, and a hole-injection layer are stacked in this order over the first electrode 7003 because an increase in voltage in the driver circuit portion can be suppressed and power consumption can be reduced.

The second electrode 7005 is formed using a conductive film which transmits visible light, such as a film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like.

The light-emitting element 7002 corresponds to a region where the EL layer 7004 including a light-emitting layer is sandwiched between the first electrode 7003 and the second electrode 7005. In the case of the pixel illustrated in FIG. 14C, light emitted from the light-emitting element 7002 is emitted to the second electrode 7005 side as indicated by arrows.

In FIG. 14C, the drain electrode layer of the driver TFT 7001 is electrically connected to the first electrode 7003 through a contact hole provided in an oxide insulating layer 7052a, a protective insulating layer 7052b, an insulating layer 7053, and an insulating layer 7055. The planarizing insulating layer 7053 can be formed using a resin material such as polyimide, acrylic, benzocyclobutene, polyamide, or epoxy. In addition to such resin materials, it is also possible to use a low-dielectric constant material (low-k material), a siloxane-based resin, phosphosilicate glass (PSG), borophosphosilicate glass (BPSG), or the like. Note that the planarizing insulating layer 7053 may be formed by stacking a plurality of insulating films formed of these materials. There is no particular limitation on the method for forming the planarizing insulating layer 7053, and the planarizing insulating layer 7053 can be formed, depending on the material, by a method such as a sputtering method, an SOG method, spin coating, dip coating, spray coating, or a droplet discharge method (such as an ink-jet method, screen printing, offset printing, or the like), or a tool (equipment) such as a doctor knife, a roll coater, a curtain coater, or a knife coater.

The partition 7009 is provided so as to insulate the first electrode 7003 and a first electrode 7008 of an adjacent pixel.

In the structure of FIG. 14C, in the case where full color display is performed, for example, a green light-emitting element is used as the light-emitting element 7002, one of adjacent light-emitting elements is a red light-emitting element, and the other is a blue light-emitting element. Alternatively, a light-emitting display device capable of full color display may be manufactured using four kinds of light-emitting elements which include a white light-emitting element in addition to the three kinds of light-emitting elements.

In the structure of FIG. 14C, a light-emitting display device capable of full color display may be manufactured in such a manner that all of a plurality of light-emitting elements which are arranged are white light-emitting elements and a sealing substrate having a color filter or the like is arranged above the light-emitting element 7002. A material which exhibits a single color such as white is formed and combined with a color filter or a color conversion layer, whereby full color display can be performed.

Needless to say, display emitting monochromatic light can also be performed. For example, a lighting device may be formed with the use of white light emission, or an area-color light-emitting device may be formed with the use of a single color light emission.

If necessary, an optical film such as a polarizing film including a circularly polarizing plate may be provided.

Note that, although the organic EL elements are described here as the light-emitting elements, an inorganic EL element can also be provided as a light-emitting element.

Note that the example is described in which a thin film transistor (a driver TFT) which controls the driving of a light-emitting element is electrically connected to the light-emitting element; however, a structure may be employed in which a TFT for current control is connected between the driver TFT and the light-emitting element.

Note that the structure of the semiconductor device described in this embodiment is not limited to those illustrated in FIGS. 14A to 14C and can be modified in various ways based on the spirit of techniques of the present invention.

Figures 15A, 15B:
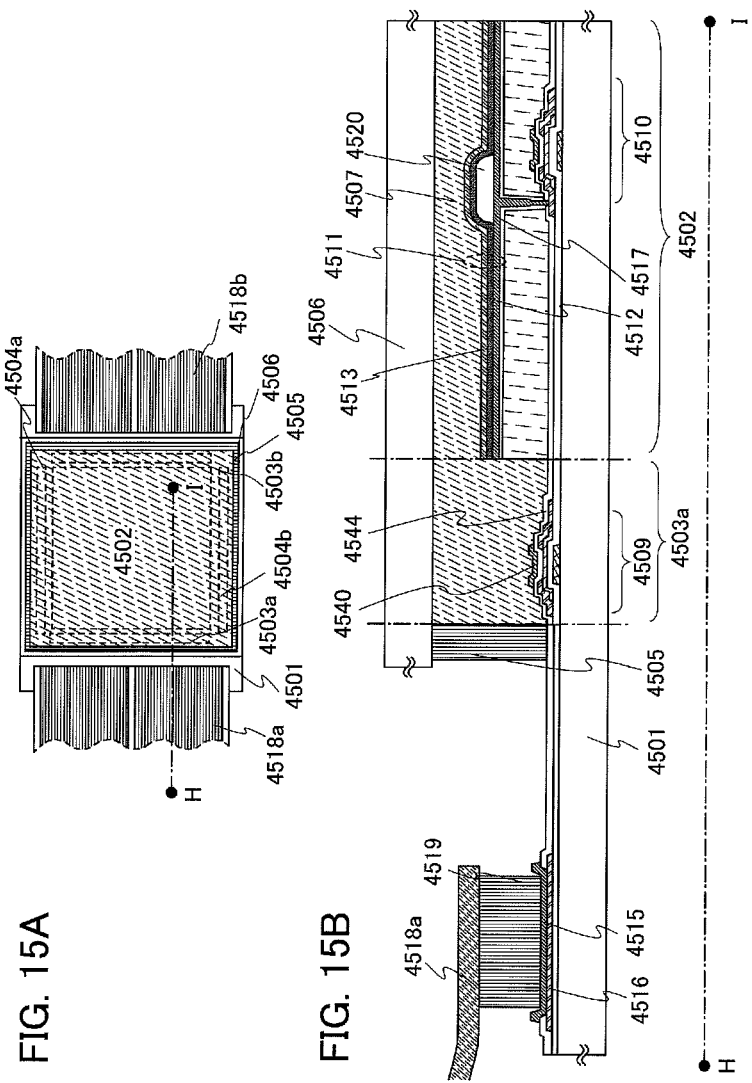
FIGS. 15A and 15B illustrate a semiconductor device according to an embodiment.

Next, the appearance and the cross section of a light-emitting display panel (also referred to as a light-emitting panel), which is an embodiment of a semiconductor device to which the thin film transistor described in Embodiment 3 is applied, are described with reference to FIGS. 15A and 15B. FIG. 15A is a top view of a panel in which a thin film transistor and a light-emitting element formed over a first substrate are sealed between the first substrate and a second substrate with a sealant. FIG. 15B is a cross-sectional view taken along line H-I of FIG. 15A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 15B.

The highly reliable thin film transistor including an In—Ga—Zn—O-based film as the oxide semiconductor layer which is described in Embodiment 3 can be used as the thin film transistors 4509 and 4510. In this embodiment, the thin film transistors 4509 and 4510 are n-channel thin film transistors.

A conductive layer 4540 is provided over part of an insulating layer 4544 so as to overlap with a channel formation region of an oxide semiconductor layer in the thin film transistor 4509 for the driver circuit. The conductive layer 4540 is provided so as to overlap with the channel formation region of the oxide semiconductor layer, whereby the amount of change in the threshold voltage of the thin film transistor 4509 before and after the BT test can be reduced. Further, a potential of the conductive layer 4540 may be the same as or different from that of a gate electrode layer of the thin film transistor 4509. The conductive layer 4540 can also function as a second gate electrode layer. Alternatively, the potential of the conductive layer 4540 may be GND or 0 V, or the conductive layer 4540 may be in a floating state.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that a structure of the light-emitting element 4511 is a layered structure of the first electrode layer 4517, an electroluminescent layer 4512, and a second electrode layer 4513, but there is no particular limitation on the structure described in this embodiment. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, and the pixel portion 4502 from FPCs 4518a and 4518b.

In this embodiment, a connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518a via an anisotropic conductive film 4519.

The second substrate located in the direction in which light is extracted from the light-emitting element 4511 needs to transmit visible light. In that case, a material which transmits visible light, such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 15A and 15B.

Through the above process, a highly reliable light-emitting display device (display panel) as a semiconductor device can be manufactured.

Note that the structure described in this embodiment can be combined with any of the structures described in other embodiments as appropriate.

Embodiment 8

A semiconductor device to which the thin film transistor described in Embodiment 3 is applied can be used for an electronic paper. An electronic paper can be used for electronic devices of a variety of fields as long as they can display data. For example, an electronic paper can be applied to an e-book reader (electronic book), a poster, an advertisement in a vehicle such as a train, or displays of various cards such as a credit card. Examples of the electronic devices are illustrated in FIGS. 16A and 16B and FIG. 17.

Figure 16A:
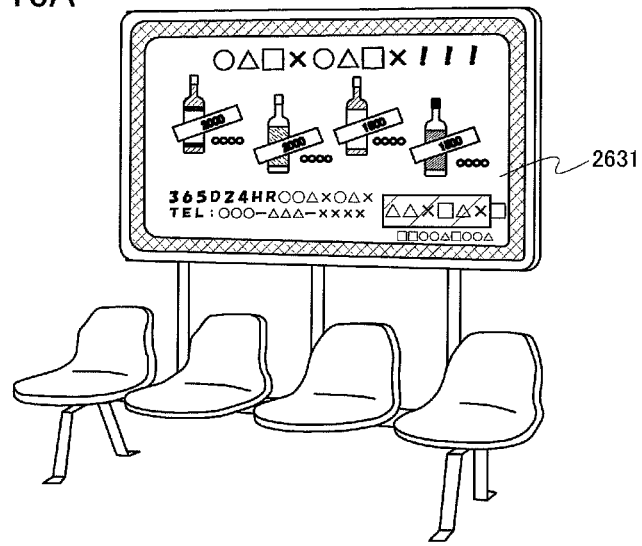
FIGS. 16A and 16B each illustrate an example of a usage pattern of an electronic paper.

FIG. 16A illustrates a poster 2631 using an electronic paper. In the case where an advertising medium is printed paper, the advertisement is replaced by hands; however, by using an electronic paper, advertising display can be changed in a short time. Furthermore, stable images can be obtained without display defects. Note that the poster may have a structure capable of wirelessly transmitting and receiving data.

Figure 16B:
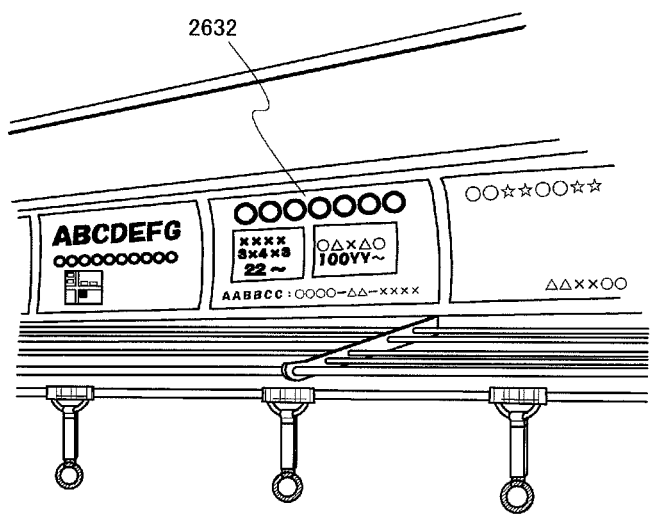

FIG. 16B illustrates an advertisement 2632 in a vehicle such as a train. In the case where an advertising medium is printed paper, the advertisement is replaced by hands; however, by using an electronic paper, advertising display can be changed in a short time without using much human resources. Furthermore, stable images can be obtained without display defects. Note that the advertisement in a vehicle may have a structure capable of wirelessly transmitting and receiving data.

Figure 17:
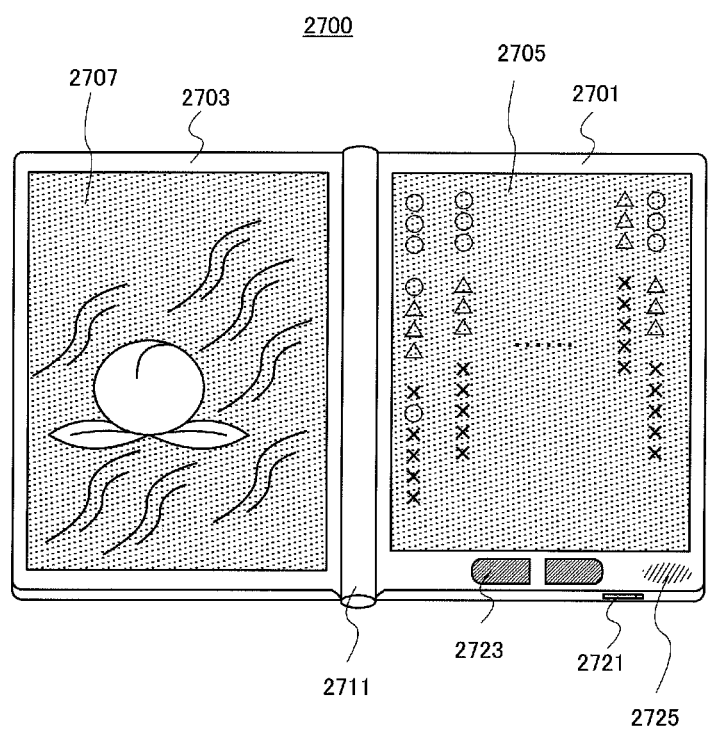
FIG. 17 is an external view of an example of an e-book reader.

FIG. 17 illustrates an example of an e-book reader. For example, an e-book reader 2700 includes two housings, a housing 2701 and a housing 2703. The housings 2701 and 2703 are bound with each other by an axis portion 2711, along which the e-book reader 2700 can be opened and closed. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 17) and graphics can be displayed on a display portion on the left side (the display portion 2707 in FIG. 17).

FIG. 17 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a structure capable of wirelessly transmitting and receiving data. Through wireless communication, desired book data or the like can be purchased and downloaded from an electronic book server.

Note that the structure described in this embodiment can be combined with any of the structures described in other embodiments as appropriate.

Embodiment 9

A semiconductor device using the thin film transistor described in Embodiment 3 can be applied to a variety of electronic devices (including an amusement machine). Examples of electronic devices are a television set (also referred to as a television or a television receiver), a monitor of a computer or the like, a camera such as a digital camera or a digital video camera, a digital photo frame, a mobile phone set (also referred to as a mobile phone or a mobile phone device), a portable game console, a portable information terminal, an audio reproducing device, a large-sized game machine such as a pachinko machine, and the like.

Figure 18A:
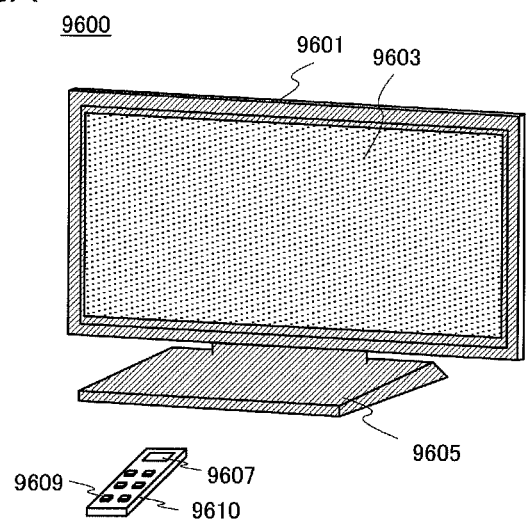
FIGS. 18A and 18B are external views of an example of a television set and an example of a digital photo frame, respectively.

FIG. 18A illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 18B:
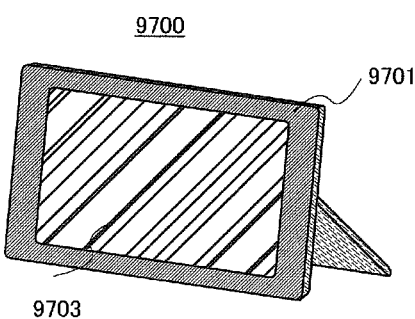

FIG. 18B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 19A:
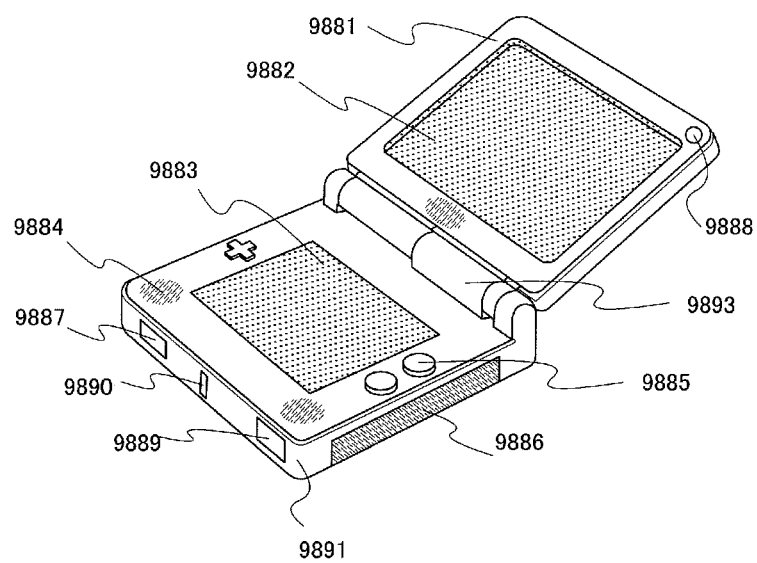
FIGS. 19A and 19B are external views each illustrating an example of an amusement machine.

FIG. 19A illustrates a portable amusement machine including two housings, a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 19A includes a speaker portion 9884, a recording medium insertion portion 9886, an LED lamp 9890, an input unit (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 9889), and the like. It is needless to say that the structure of the portable amusement machine is not limited to the above and other structures provided with at least a semiconductor device of the present invention may be employed. The portable amusement machine may include other accessory equipment as appropriate. The portable amusement machine illustrated in FIG. 19A has a function of reading a program or data stored in a recording medium to display it on the display portion, and a function of sharing information with another portable amusement machine by wireless communication. Note that the portable game machine illustrated in FIG. 19A can have a variety of functions without being limited to the above.

Figure 19B:
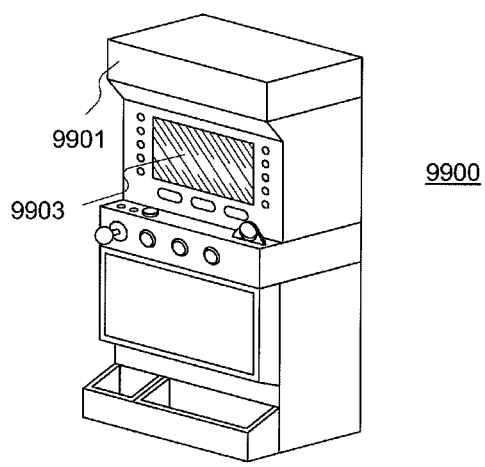

FIG. 19B illustrates an example of a slot machine which is a large-sized amusement machine. In a slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device of the present invention may be employed. The slot machine 9900 may include other accessory equipment as appropriate.

Figure 20A:
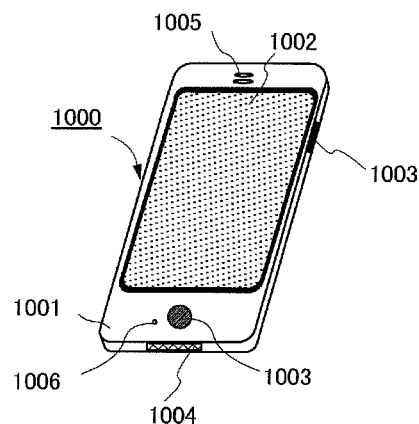
FIGS. 20A and 20B are external views each illustrating an example of a mobile phone.

FIG. 20A illustrates an example of a mobile phone. A mobile phone 1000 includes a display portion 1002 incorporated in a housing 1001, an operation button 1003, an external connection port 1004, a speaker 1005, a microphone 1006, and the like.

In the mobile phone 1000 illustrated in FIG. 20A, data can be input when users touch the display portion 1002 with their fingers or the like. Users can make a call or compose a mail by touching the display portion 1002 with their fingers or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the mobile phone 1000, display in the screen of the display portion 1002 can be automatically switched by determining the orientation of the mobile phone 1000 (whether the mobile phone 1000 is placed horizontally or vertically for a landscape mode or a portrait mode).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is a signal of moving image data, the screen mode is switched to the display mode. When the signal is text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits near-infrared light in the display portion, an image of a finger vein, a palm vein, or the like can be taken.

Figure 20B:
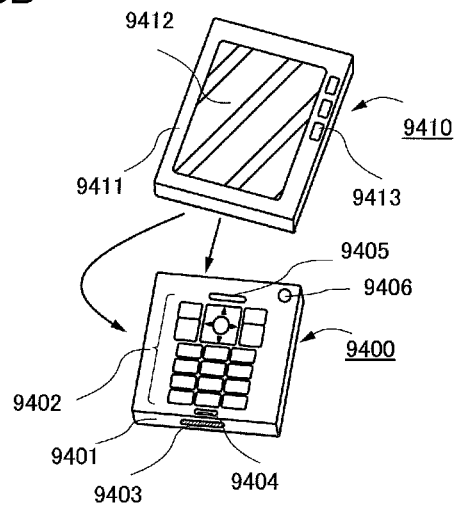

FIG. 20B illustrates another example of a mobile phone. The mobile phone set illustrated in FIG. 20B is provided with a display device 9410 having a display portion 9412 and operation buttons 9413 in a housing 9411 and a communication device 9400 having operation buttons 9402, an external input terminal 9403, a microphone 9404, a speaker 9405, and a light-emitting portion 9406 which emits light when receiving a call in a housing 9401. The display device 9410 having a display function can be detached from or attached to the communication device 9400 having a telephone function in two directions indicated by arrows. Thus, a minor axis of the display device 9410 can be attached to a minor axis of the communication device 9400, and a major axis of the display device 9410 can be attached to a major axis of the communication device 9400. In addition, when only the display function is needed, the display device 9410 can be detached from the communication device 9400 and used alone. Images or input information can be transmitted or received by wireless or wired communication between the communication device 9400 and the display device 9410, each of which has a rechargeable battery.

Note that the structure described in this embodiment can be combined with any of the structures described in other embodiments as appropriate.

This application is based on Japanese Patent Application serial no. 2009-260414 filed with Japan Patent Office on Nov. 13, 2009, the entire contents of which are hereby incorporated by reference.

What is claimed is:

1. A packaged sputtering target comprising:
    a backing plate including a mounting portion for a placement portion;
    a sintered body fixed to the backing plate; and
    a package attached to the backing plate so as to surround the sintered body without covering the mounting portion,
    wherein an inside of the package is filled with a gas having a dew point that is less than or equal to −40° C.,
    wherein the sintered body comprises indium, gallium, and zinc,
    wherein the package includes a valve, and
    wherein the package comprises a metal plate, a metal foil, or a polymer film.

2. The packaged sputtering target according to claim 1, wherein the sintered body is used to form a semiconductor layer including a channel formation region of a transistor.

3. A method for packaging a sputtering target, comprising:
    fixing a sintered body to a backing plate including a mounting portion for a placement portion in an atmosphere in which dew point is less than or equal to −40° C.; and
    attaching a package to the backing plate so as to surround the sintered body without covering the mounting portion in the atmosphere in which the dew point is less than or equal to −40° C.,
    wherein the sintered body comprises indium, gallium, and zinc,
    wherein the package includes a valve, and
    wherein the package comprises a metal plate, a metal foil, or a polymer film.

4. A method for mounting a packaged sputtering target, comprising:
    storing a target material in a package without covering a mounting portion for a placement portion in an atmosphere in which dew point is less than or equal to −40° C.;
    mounting the target material stored in the package on the placement portion in a deposition chamber of a deposition apparatus;
    evacuating the deposition chamber;
    filling the deposition chamber with an inert gas; and
    detaching the package in the deposition chamber after the evacuating,
    wherein the target material includes a sintered body and a backing plate,
    wherein the sintered body comprises indium, gallium, and zinc
    wherein the package includes a valve, and
    wherein the package comprises a metal plate, a metal foil, or a polymer film.

5. The packaged sputtering target according to claim 1, wherein the package is fitted to a fitting rail of the backing plate so as to seal the sintered body.

6. The method for packaging a sputtering target according to claim 3, wherein the sintered body is used to form a semiconductor layer including a channel formation region of a transistor.

7. The method for packaging a sputtering target according to claim 3, further comprising:
    performing heat treatment to the sintered body in an atmosphere including oxygen before fixing the sintered body so that an oxygen deficiency is reduced.

8. The method for packaging a sputtering target according to claim 3, wherein the package is fitted to a fitting rail of the backing plate so as to seal the sintered body.

9. The method for mounting the packaged sputtering target according to claim 4, wherein the sintered body is used to form a semiconductor layer including a channel formation region of a transistor.

10. The method for mounting the packaged sputtering target according to claim 4, wherein the package is fitted to a fitting rail of the backing plate so as to seal the sintered body.

11. The method for mounting the packaged sputtering target according to claim 4,
    wherein the inert gas includes at least one of He, Ne, and Ar, and
    wherein purity of the inert gas is higher than 99.9999%.

12. The packaged sputtering target according to claim 1, wherein a filling rate of the sintered body is 90% to 100%.

13. The method for packaging a sputtering target according to claim 3, wherein a filling rate of the sintered body is 90% to 100%.

14. The method for mounting the packaged sputtering target according to claim 4, wherein a filling rate of the sintered body is 90% to 100%.

15. The packaged sputtering target according to claim 1, wherein the package comprises a silicon nitride film or a silicon oxide film.

16. The method for packaging a sputtering target according to claim 3, wherein the package comprises a silicon nitride film or a silicon oxide film.

17. The method for mounting the packaged sputtering target according to claim 4, wherein the package comprises a silicon nitride film or a silicon oxide film.

* * * * *